(12) United States Patent
King et al.

(10) Patent No.: US 12,095,430 B2
(45) Date of Patent: Sep. 17, 2024

(54) POWER AMPLIFIER POWER MANAGEMENT IN USER EQUIPMENT

(71) Applicant: Skyworks Solutions, Inc., Irvine, CA (US)

(72) Inventors: Joel Richard King, Newbury Park, CA (US); Shayan Farahvash, Kensington, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 426 days.

(21) Appl. No.: 17/445,169

(22) Filed: Aug. 16, 2021

(65) Prior Publication Data

US 2022/0069788 A1   Mar. 3, 2022

Related U.S. Application Data

(60) Provisional application No. 62/706,587, filed on Aug. 26, 2020.

(51) Int. Cl.

| | |
|---|---|
| *H03F 3/24* | (2006.01) |
| *H03F 1/02* | (2006.01) |
| *H03F 1/56* | (2006.01) |
| *H03F 3/195* | (2006.01) |
| *H04B 1/38* | (2015.01) |
| *H04B 1/40* | (2015.01) |

(52) U.S. Cl.
CPC ........... *H03F 3/245* (2013.01); *H03F 1/0233* (2013.01); *H03F 1/0238* (2013.01); *H03F 1/56* (2013.01); *H03F 3/195* (2013.01); *H04B 1/38* (2013.01); *H04B 1/40* (2013.01); *H03F 2200/102* (2013.01); *H03F 2200/105* (2013.01); *H03F 2200/387* (2013.01); *H03F 2200/451* (2013.01)

(58) Field of Classification Search
CPC ...... H03F 3/245; H03F 1/0233; H03F 1/0238; H03F 1/56; H03F 3/195; H03F 2200/102; H03F 2200/105; H03F 2200/387; H03F 2200/451; H03F 3/213; H03F 1/0222; H03F 3/19; H04B 1/38; H04B 1/40; H04B 7/0413; H04L 5/001
USPC ......................................... 330/297, 126–127
See application file for complete search history.

(56) References Cited

U.S. PATENT DOCUMENTS

| | | |
|---|---|---|
| 6,657,488 B1 | 12/2003 | King et al. |
| 9,344,140 B2 | 5/2016 | Reisner et al. |
| 9,496,913 B2 | 11/2016 | King et al. |
| 9,503,025 B2 | 11/2016 | Cao et al. |

(Continued)

*Primary Examiner* — Hieu P Nguyen
(74) *Attorney, Agent, or Firm* — Knobbe, Martens, Olson & Bear, LLP

(57) ABSTRACT

Apparatus and methods for power amplifier power management are disclosed. In certain embodiments, a mobile device includes a transceiver that generates a radio frequency signal, a front-end system including a first power amplifier module that amplifies the radio frequency signal, and a power management system including an envelope tracking power management unit that provides an envelope tracking supply voltage to the first power amplifier module, and a first average power tracking power management unit that provides an average power tracking supply voltage to the first power amplifier module. The first power amplifier module is configured to selectively switch between the envelope tracking supply voltage and the average power tracking supply voltage.

20 Claims, 14 Drawing Sheets

(56) References Cited

U.S. PATENT DOCUMENTS

| | | |
|---|---|---|
| 9,572,052 B2 | 2/2017 | King et al. |
| 9,628,134 B2 | 4/2017 | Reisner et al. |
| 9,866,268 B2 | 1/2018 | King et al. |
| 9,991,918 B2 | 6/2018 | King et al. |
| 10,014,889 B2 | 7/2018 | King et al. |
| 10,033,423 B2 | 7/2018 | Reisner et al. |
| 10,075,199 B2 | 9/2018 | King et al. |
| 10,103,754 B2 | 10/2018 | King |
| 10,135,408 B2 | 11/2018 | Cao et al. |
| 10,153,736 B2 | 12/2018 | King et al. |
| 10,211,857 B2 | 2/2019 | King et al. |
| 10,230,413 B2 | 3/2019 | Wloczysiak et al. |
| 10,256,851 B2 | 4/2019 | Pehlke et al. |
| 10,257,119 B2 | 4/2019 | Wloczysiak et al. |
| 10,340,961 B2 | 7/2019 | King et al. |
| 10,454,506 B2 | 10/2019 | King et al. |
| 10,623,337 B2 | 4/2020 | Wloczysiak et al. |
| 10,630,320 B2 | 4/2020 | King |
| 10,985,784 B2 | 4/2021 | King |
| 11,038,471 B2 | 6/2021 | Drogi et al. |
| 11,095,575 B2 | 8/2021 | Wloczysiak et al. |
| 11,128,323 B2 | 9/2021 | Pehlke et al. |
| 11,336,242 B2 * | 5/2022 | Kim ............... H03F 3/245 |
| 2014/0038675 A1 | 2/2014 | Khlat et al. |
| 2014/0106693 A1 | 4/2014 | Khlat |
| 2014/0266429 A1 | 9/2014 | Khlat et al. |
| 2016/0127016 A1 | 5/2016 | Pehlke et al. |
| 2017/0373730 A1 | 12/2017 | Pehlke et al. |
| 2018/0309409 A1 | 10/2018 | Khlat |
| 2019/0273523 A1 | 9/2019 | Wloczysiak et al. |
| 2019/0386616 A1 | 12/2019 | King et al. |
| 2020/0162114 A1 | 5/2020 | King et al. |
| 2020/0287583 A1 | 9/2020 | Farahvash et al. |
| 2020/0412307 A1 | 12/2020 | Hitomi et al. |
| 2021/0099135 A1 | 4/2021 | Balteanu et al. |
| 2021/0194515 A1 | 6/2021 | Go et al. |
| 2021/0218370 A1 | 7/2021 | Balteanu et al. |
| 2021/0273614 A1 | 9/2021 | Drogi et al. |
| 2022/0069787 A1 | 3/2022 | King et al. |

* cited by examiner

POWER AMPLIFIER POWER MANAGEMENT IN USER EQUIPMENT

CROSS-REFERENCE TO RELATED APPLICATIONS

This application claims the benefit of priority under 35 U.S.C. § 119 of U.S. Provisional Patent Application No. 62/706,587, filed Aug. 26, 2020 and titled "POWER AMPLIFIER POWER MANAGEMENT IN USER EQUIPMENT," which is herein incorporated by reference in its entirety.

BACKGROUND

Field

Embodiments of the invention relate to electronic systems, and in particular, to radio frequency electronics.

Description of Related Technology

Radio frequency (RF) communication systems can be used for transmitting and/or receiving signals of a wide range of frequencies. For example, an RF communication system can be used to wirelessly communicate RF signals in a frequency range of about 30 kHz to 300 GHz, such as in the range of about 410 MHz to about 7.125 GHz for fifth generation (5G) communications using Frequency Range 1 (FR1) or in the range of about 24.25 GHz to 52.6 GHz for 5G communications using Frequency Range 2 (FR2).

Examples of RF communication systems include, but are not limited to, mobile phones, tablets, base stations, network access points, customer-premises equipment (CPE), laptops, and wearable electronics.

SUMMARY

In certain embodiments, the present disclosure relates to a mobile device. The mobile device includes a transceiver configured to generate a radio frequency signal, a front-end system including a first power amplifier module configured to amplify the radio frequency signal, and a power management system including an envelope tracking power management unit configured to provide an envelope tracking supply voltage to the first power amplifier module, and a first average power tracking power management unit configured to provide an average power tracking supply voltage to the first power amplifier module, the first power amplifier module configured to selectively switch between the envelope tracking supply voltage and the average power tracking supply voltage.

In some embodiments, the first power amplifier module is configured to provide amplification in a low band.

In several embodiments, the front-end system further includes a second power amplifier module configured to receive power from the envelope tracking supply voltage and a third power amplifier module configured to receive power from the average power tracking supply voltage. According to a number of embodiments, the first power amplifier module is configured to provide amplification in a low band, the second power amplifier module is configured to provide amplification in a mid band and a high band, and the third power amplifier module is configured to provide amplification in an ultrahigh band. In accordance with various embodiments, the front-end system further includes a fourth power amplifier module configured to provide amplification in the low band, a fifth power amplifier module configured to provide amplification in the mid band and the high band, and a sixth power amplifier module configured to provide amplification in the ultrahigh band. According to some embodiments, the power management system further includes a second average power tracking power management unit configured to provide power to the fourth power amplifier module, the fifth power amplifier module, and the sixth power amplifier module. In accordance with various embodiments, the first average power tracking power management unit, the envelope tracking power management unit, the first power amplifier module, the second power amplifier module, and the third power amplifier module are on a first side of the mobile phone, and the second average power tracking power management unit, the fourth power amplifier module, the fifth power amplifier module, and the sixth power amplifier module are on a second side of the mobile phone.

In some embodiments, the front-end system further includes a second power amplifier module configured to receive power from the average power tracking supply voltage and to provide amplification in the low band. According to a number of embodiments, the first power amplifier module is on a first side of the mobile phone and the second power amplifier module is on a second side of the mobile phone. In accordance with various embodiments, the front-end system further includes a third power amplifier module configured to provide amplification in an ultrahigh band and to selectively switch between the envelope tracking supply voltage and the average power tracking supply voltage. According to several embodiments, the front-end system further includes a fourth power amplifier module configured to provide amplification in the ultrahigh band and to receive power from the average power tracking supply voltage. In accordance with a number of embodiments, the first average power tracking power management unit, the envelope tracking power management unit, the first power amplifier module, and the third power amplifier module are on a first side of the mobile phone, and the second power amplifier module and the fourth power amplifier module are on a second side of the mobile phone. According to various embodiments, the front-end system further includes a fifth power amplifier module on the first side of the mobile phone and configured to receive power from the envelope tracking supply voltage and to provide amplification in a mid band and a high band, and a sixth power amplifier module on the second side of the mobile phone and configured to receive power from the average power tracking supply voltage and to provide amplification in the mid band and the high band.

In several embodiments, the envelope tracking unit is on a first side of the mobile phone and the first average power tracking power management unit and the first power amplifier module are on a second side of the mobile phone. According to a number of embodiments, the front-end system further includes a second power amplifier module on the first side of the mobile phone and configured to receive power from the envelope tracking supply voltage. In accordance with various embodiments, the first power amplifier module is configured to provide amplification in a low band and the second power amplifier module is configured to provide amplification in a mid band and a high band. According to some embodiments, the power management system further includes a second average power tracking power management unit on the first side of the mobile phone, and the front-end system further includes a third power amplifier module on the first side of the mobile phone and configured to receive power from the second average power tracking power management unit and to provide amplification in an ultrahigh band. According to some embodiments, the front-end system further includes a fourth power amplifier module on the second side of the mobile phone and configured to receive power from the envelope tracking power management unit and to provide amplification in the mid band and the high band. In accordance with a number of embodiments, the front-end system further includes a third power amplifier module on the second side of the mobile phone and configured to receive power from the first average power tracking power management unit and to provide amplification in the mid band and the high band. In accordance with some embodiments, the front-end system further includes a fourth power amplifier module on the first side of the mobile phone and configured to receive power from the first average power tracking power management unit and to provide amplification in an ultrahigh band.

In certain embodiments, the present disclosure relates to a phone board assembly for a mobile phone. The phone board assembly includes a first power amplifier module configured to amplify a radio frequency signal, an envelope tracking power management unit configured to provide an envelope tracking supply voltage to the first power amplifier module, and a first average power tracking power management unit configured to provide an average power tracking supply voltage to the first power amplifier module, the first power amplifier module configured to selectively switch between the envelope tracking supply voltage and the average power tracking supply voltage.

In various embodiments, the first power amplifier module is configured to provide amplification in a low band.

In some embodiments, the phone board assembly further includes a second power amplifier module configured to receive power from the envelope tracking supply voltage and a third power amplifier module configured to receive power from the average power tracking supply voltage. According to several embodiments, the first power amplifier module is configured to provide amplification in a low band, the second power amplifier module is configured to provide amplification in a mid band and a high band, and the third power amplifier module is configured to provide amplification in an ultrahigh band. In accordance with a number of embodiments, the phone board assembly further includes a fourth power amplifier module configured to provide amplification in the low band, a fifth power amplifier module configured to provide amplification in the mid band and the high band, and a sixth power amplifier module configured to provide amplification in the ultrahigh band. According to various embodiments, the phone board assembly further includes a second average power tracking power management unit configured to provide power to the fourth power amplifier module, the fifth power amplifier module, and the sixth power amplifier module. In accordance with several embodiments, the first average power tracking power management unit, the envelope tracking power management unit, the first power amplifier module, the second power amplifier module, and the third power amplifier module are on a first side of the phone board assembly, and the second average power tracking power management unit, the fourth power amplifier module, the fifth power amplifier module, and the sixth power amplifier module are on a second side of the phone board assembly.

In some embodiments, the phone board assembly further includes a second power amplifier module configured to receive power from the average power tracking supply voltage and to provide amplification in the low band. According to several embodiments, the first power amplifier module is on a first side of the phone board assembly and the second power amplifier module is on a second side of the phone board assembly. In accordance with a number of embodiments, the phone board assembly further includes a third power amplifier module configured to provide amplification in an ultrahigh band and to selectively switch between the envelope tracking supply voltage and the average power tracking supply voltage. According to various embodiments, the phone board assembly further includes a fourth power amplifier module configured to provide amplification in the ultrahigh band and to receive power from the average power tracking supply voltage. In accordance with several embodiments, the first average power tracking power management unit, the envelope tracking power management unit, the first power amplifier module, and the third power amplifier module are on a first side of the phone board assembly, and the second power amplifier module and the fourth power amplifier module are on a second side of the phone board assembly. According to a number of embodiments, the phone board assembly further includes a fifth power amplifier module on the first side of the phone board assembly and configured to receive power from the envelope tracking supply voltage and to provide amplification in a mid band and a high band, and a sixth power amplifier module on the second side of the phone board assembly and configured to receive power from the average power tracking supply voltage and to provide amplification in the mid band and the high band.

In several embodiments, the envelope tracking unit is on a first side of the phone board assembly and the first average power tracking power management unit and the first power amplifier module are on a second side of the phone board assembly. According to a number of embodiments, the phone board assembly further includes a second power amplifier module on the first side of the phone board assembly and configured to receive power from the envelope tracking supply voltage. In accordance with several embodiments, the first power amplifier module is configured to provide amplification in a low band and the second power amplifier module is configured to provide amplification in a mid band and a high band. According to a number of embodiments, the phone board assembly further includes a second average power tracking power management unit on the first side of the phone board assembly, and a third power amplifier module on the first side of the phone board assembly and configured to receive power from the second average power tracking power management unit and to provide amplification in an ultrahigh band. In accordance with various embodiments, the front-end system further includes a fourth power amplifier module on the second side of the phone board assembly and configured to receive power from the envelope tracking power management unit and to provide amplification in the mid band and the high band. According to several embodiments, the phone board assembly further includes a third power amplifier module on the second side of the phone board assembly and configured to receive power from the first average power tracking power management unit and to provide amplification in the mid band and the high band. In accordance with a number of embodiments, the phone board assembly further includes a fourth power amplifier module on the first side of the phone board assembly and configured to receive power from the first average power tracking power management unit and to provide amplification in an ultrahigh band.

In certain embodiments, the present disclosure relates to a method of power management in a mobile device. The method includes amplifying a radio frequency signal using a first power amplifier module, providing an envelope tracking supply voltage to the first power amplifier module using an envelope tracking power management unit, providing an average power tracking supply voltage to the first power amplifier module using a first average power tracking power management unit, and selectively switching between the envelope tracking supply voltage and the average power tracking supply voltage using the first power amplifier module.

In various embodiments, the method further includes providing amplification in a low band using the first power amplifier module.

According to some embodiments, the method further includes powering a second power amplifier module using the envelope tracking supply voltage and powering a third power amplifier module using the average power tracking supply voltage. According to several embodiments, the method further includes providing amplification in a low band using the first power amplifier module, providing amplification in a mid band and a high band using the second power amplifier module, and providing amplification in an ultrahigh ban using the third power amplifier module. In accordance with a number of embodiments, the method further includes providing amplification in the low band using a fourth power amplifier module, providing amplification in the mid band and the high band using a fifth power amplifier module, and providing amplification in the ultrahigh band using a sixth power amplifier module. In accordance with various embodiments, the method further includes providing power to the fourth power amplifier module, the fifth power amplifier module, and the sixth power amplifier module using a second average power tracking power management unit. According to a number of embodiments, the first average power tracking power management unit, the envelope tracking power management unit, the first power amplifier module, the second power amplifier module, and the third power amplifier module are on a first side of a phone board assembly, and the second average power tracking power management unit, the fourth power amplifier module, the fifth power amplifier module, and the sixth power amplifier module are on a second side of the phone board assembly.

In several embodiments, the method further includes powering a second power amplifier module using the average power tracking supply voltage, and providing amplification in the low band using the second power amplifier module. According to some embodiments, the first power amplifier module is on a first side of a phone board assembly and the second power amplifier module is on a second side of the phone board assembly. In accordance with various embodiments, the method further includes providing amplification in an ultrahigh band using a third power amplifier module, and selectively switching between the envelope tracking supply voltage and the average power tracking supply voltage using the third power amplifier module. According to a number of embodiments, the method further includes powering a fourth power amplifier module using the average power tracking supply voltage, and providing amplification in the ultrahigh band using the fourth power amplifier module. In accordance with some embodiments, the first average power tracking power management unit, the envelope tracking power management unit, the first power amplifier module, and the third power amplifier module are on a first side of a phone board assembly, and the second power amplifier module and the fourth power amplifier module are on a second side of the phone board assembly. According to several embodiments, the method further includes powering a fifth power amplifier module on the first side of the phone board assembly using the envelope tracking supply voltage, providing amplification in a mid band and a high band using the fifth power amplifier module, powering a sixth power amplifier module on the second side of the phone board assembly using the average power tracking supply voltage, and providing amplification in the mid band and the high band using the sixth power amplifier module.

In some embodiments, the envelope tracking unit is on a first side of a phone board assembly and the first average power tracking power management unit and the first power amplifier module are on a second side of the phone board assembly. According to a number of embodiments, the method further includes powering a second power amplifier module on the first side of the phone board assembly using the envelope tracking supply voltage. In accordance with various embodiments, the method further includes providing amplification in a low band using the first power amplifier module, and providing amplification in a mid band and a high band using the second power amplifier module. According to several embodiments, the method further includes powering a third power amplifier module on the first side of the phone board assembly using a second average power tracking power management unit on the first side of the phone board assembly, and providing amplification in an ultrahigh band using the third power amplifier module. In accordance with a number of embodiments, the method further includes powering a fourth power amplifier module on the second side of the phone board assembly using the envelope tracking power management unit, and providing amplification in the mid band and the high band using the fourth power amplifier module. According to several embodiments, the method further includes powering a third power amplifier module on the second side of the phone board assembly using the first average power tracking power management unit, and providing amplification in the mid band and the high band using the third power amplifier module. In accordance with various embodiments, the method further includes powering a fourth power amplifier module on the first side of the phone board assembly using the first average power tracking power management unit, and providing amplification in an ultrahigh band using the fourth power amplifier module.

In certain embodiments, the present disclosure relates to a mobile device. The mobile device includes a transceiver configured to generate a first radio frequency signal and a second radio frequency signal, a front-end system including a first power amplifier module configured to amplify the first radio frequency signal, and a second power amplifier module configured to amplify a second radio frequency signal, and a power management system including a first multi-mode power management unit configured to generate a first shared power amplifier supply voltage for the first power amplifier module and the second power amplifier module, the first multi-mode power management unit operable in a plurality of modes including an envelope tracking mode and an average power tracking mode.

In various embodiments, the first power amplifier module is configured to provide amplification in an ultrahigh band and the second power amplifier module is configured to provide amplification in a mid band and a high band.

In some embodiments, the front-end system further includes a third power amplifier module and a fourth power amplifier module, the power management system further including a second multi-mode power management unit configured to generate a second shared power amplifier supply voltage for the third power amplifier module and the fourth power amplifier module. According to several embodiments, the first power amplifier module, the second power amplifier module, and the first multi-mode power management unit are located on a first side of the mobile phone, and the third power amplifier module, the fourth power amplifier module, and the second multi-mode power management unit are located on a second side of the mobile phone. In accordance with a number of embodiments, no power supply lines cross the first side and the second side.

In various embodiments, the first power amplifier module is configured to provide amplification in an ultrahigh band, the second power amplifier module is configured to provide amplification in a mid band and a high band, the third power amplifier module is configured to provide amplification in a low band, and the fourth power amplifier module is configured to provide amplification in the mid band and the high band. According to a number of embodiments, the front-end system further includes a fifth power amplifier module configured to receive power from the first shared power amplifier supply voltage and to provide amplification in the low band, and a sixth power amplifier module configured to receive power from the second shared power amplifier supply voltage and to provide amplification in the mid band and the high band. In accordance with several embodiments, the front-end system further includes a seventh power amplifier module configured to receive power from the first shared power amplifier supply voltage and to provide amplification to a second generation cellular signal.

In certain embodiments, the present disclosure relates to a phone board assembly for a mobile phone. The phone board assembly includes a first power amplifier module configured to amplify a first radio frequency signal, a second power amplifier module configured to amplify a second radio frequency signal, and a first multi-mode power management unit configured to generate a first shared power amplifier supply voltage for the first power amplifier module and the second power amplifier module, the first multi-mode power management unit operable in a plurality of modes including an envelope tracking mode and an average power tracking mode.

In various embodiments, the first power amplifier module is configured to provide amplification in an ultrahigh band and the second power amplifier module is configured to provide amplification in a mid band and a high band.

In several embodiments, the phone board assembly further includes a third power amplifier module, a fourth power amplifier module, and a second multi-mode power management unit configured to generate a second shared power amplifier supply voltage for the third power amplifier module and the fourth power amplifier module. According to a number of embodiments, the first power amplifier module, the second power amplifier module, and the first multi-mode power management unit are attached to a first side of the phone board assembly, and the third power amplifier module, the fourth power amplifier module, and the second multi-mode power management unit are attached to a second side of the phone board assembly. In accordance with several embodiments, no power supply lines cross the first side and the second side.

In a number of embodiments, the first power amplifier module is configured to provide amplification in an ultrahigh band, the second power amplifier module is configured to provide amplification in a mid band and a high band, the third power amplifier module is configured to provide amplification in a low band, and the fourth power amplifier module is configured to provide amplification in the mid band and the high band. According to various embodiments, the phone board assembly further includes a fifth power amplifier module configured to receive power from the first shared power amplifier supply voltage and to provide amplification in the low band, and a sixth power amplifier module configured to receive power from the second shared power amplifier supply voltage and to provide amplification in the mid band and the high band. In accordance with some embodiments, the phone board assembly further includes a seventh power amplifier module configured to receive power from the first shared power amplifier supply voltage and to provide amplification to a second generation cellular signal.

In certain embodiments, the present disclosure relates to a method of power management in a mobile device. The method further includes amplifying a first radio frequency signal using a first power amplifier module, amplifying a second radio frequency signal using a second power amplifier module, and generating a first shared power amplifier supply voltage for the first power amplifier module and the second power amplifier module using a first multi-mode power management unit that is operable in a plurality of modes including an envelope tracking mode and an average power tracking mode.

In some embodiments, the method further includes providing amplification in an ultrahigh band using the first power amplifier module and providing amplification in a mid band and a high band using the second power amplifier module.

In several embodiments, the method further includes generating a second shared power amplifier supply voltage for a third power amplifier module and a fourth power amplifier module using a second multi-mode power management unit. According to a number of embodiments, the first power amplifier module, the second power amplifier module, and the first multi-mode power management unit are attached to a first side of a phone board assembly, and the third power amplifier module, the fourth power amplifier module, and the second multi-mode power management unit are attached to a second side of the phone board assembly. In accordance with some embodiments, no power supply lines cross the first side and the second side. According to various embodiments, the method further includes providing amplification in an ultrahigh band using the first power amplifier module, providing amplification in a mid band and a high band using the second power amplifier module, providing amplification in a low band using a third power amplifier module, and providing amplification in the mid band and the high band using the fourth power amplifier module. In accordance with several embodiments, the method further includes powering a fifth power amplifier module using the first shared power amplifier supply voltage, providing amplification in the low band using the fifth power amplifier module, powering a sixth power amplifier module using the second shared power amplifier supply voltage, and providing amplification in the mid band and the high band using the sixth power amplifier module. In accordance with a number of embodiments, the method further includes powering a seventh power amplifier module using the first shared power amplifier supply voltage, and providing amplification to a second generation cellular signal using the seventh power amplifier module.

DETAILED DESCRIPTION OF EMBODIMENTS

Figure 1:
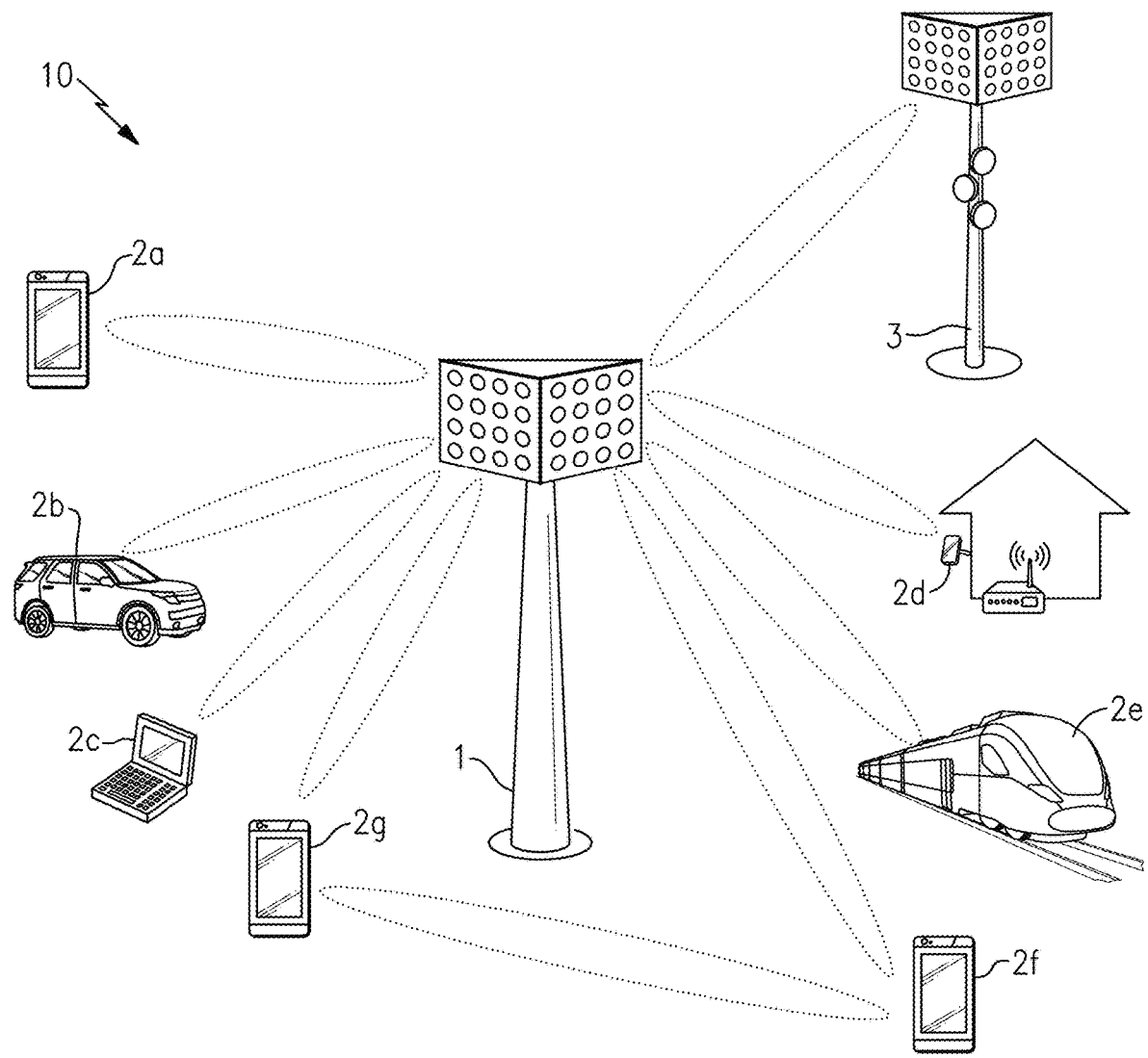
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and introduced Phase 2 of 5G technology in Release 16. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2g and mobile device 2f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

In certain implementations, the communication network 10 supports supplementary uplink (SUL) and/or supplementary downlink (SDL). For example, when channel conditions are good, the communication network 10 can direct a particular UE to transmit using an original uplink frequency, while when channel condition is poor (for instance, below a certain criteria) the communication network 10 can direct the UE to transmit using a supplementary uplink frequency that is lower than the original uplink frequency. Since cell coverage increases with lower frequency, communication range and/or signal-to-noise ratio (SNR) can be increased using SUL. Likewise, SDL can be used to transmit using an original downlink frequency when channel conditions are good, and to transmit using a supplementary downlink frequency when channel conditions are poor.

Figure 2A:
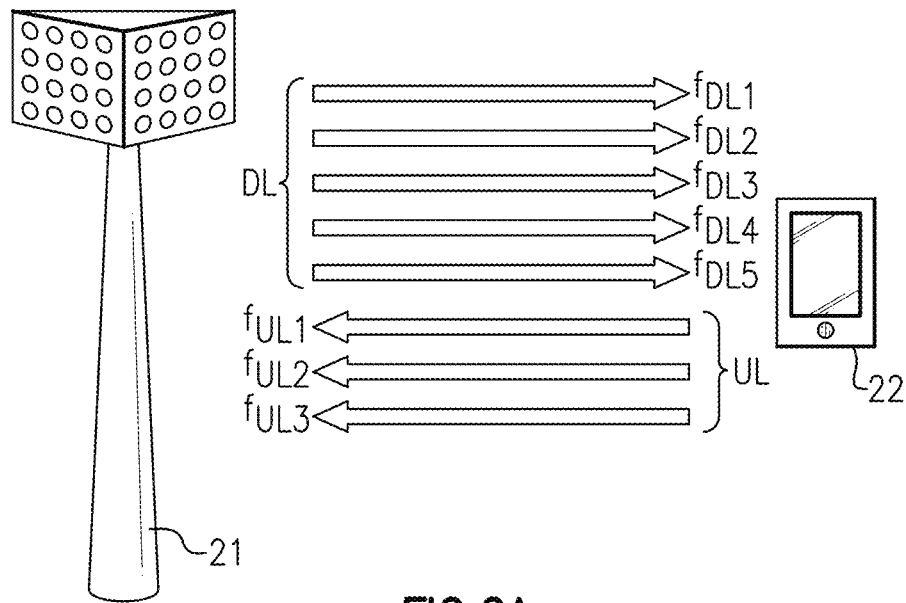
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
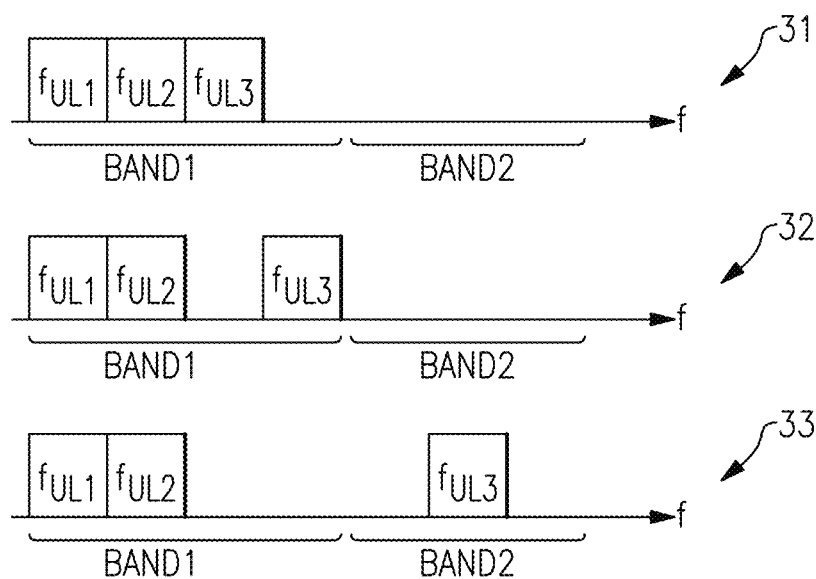
FIG. 2B illustrates various examples of uplink carrier aggregation for the communication link of FIG. 2A.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier $f_{UL1}$, a second component carrier $f_{UL2}$, and a third component carrier $f_{UL3}$. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{UL1}$, $f_{UL2}$, and $f_{UL3}$ that are contiguous and located within a first frequency band BAND1.

With continuing reference to FIG. 2B, the second carrier aggregation scenario 32 illustrates intra-band non-continuous carrier aggregation, in which two or more components carriers that are non-adjacent in frequency and within a common frequency band are aggregated. For example, the second carrier aggregation scenario 32 depicts aggregation of component carriers $f_{UL1}$, $f_{UL2}$, and $f_{UL3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers $f_{UL1}$ and $f_{UL2}$ of a first frequency band BAND1 with component carrier $f_{UL3}$ of a second frequency band BAND2.

Figure 2C:
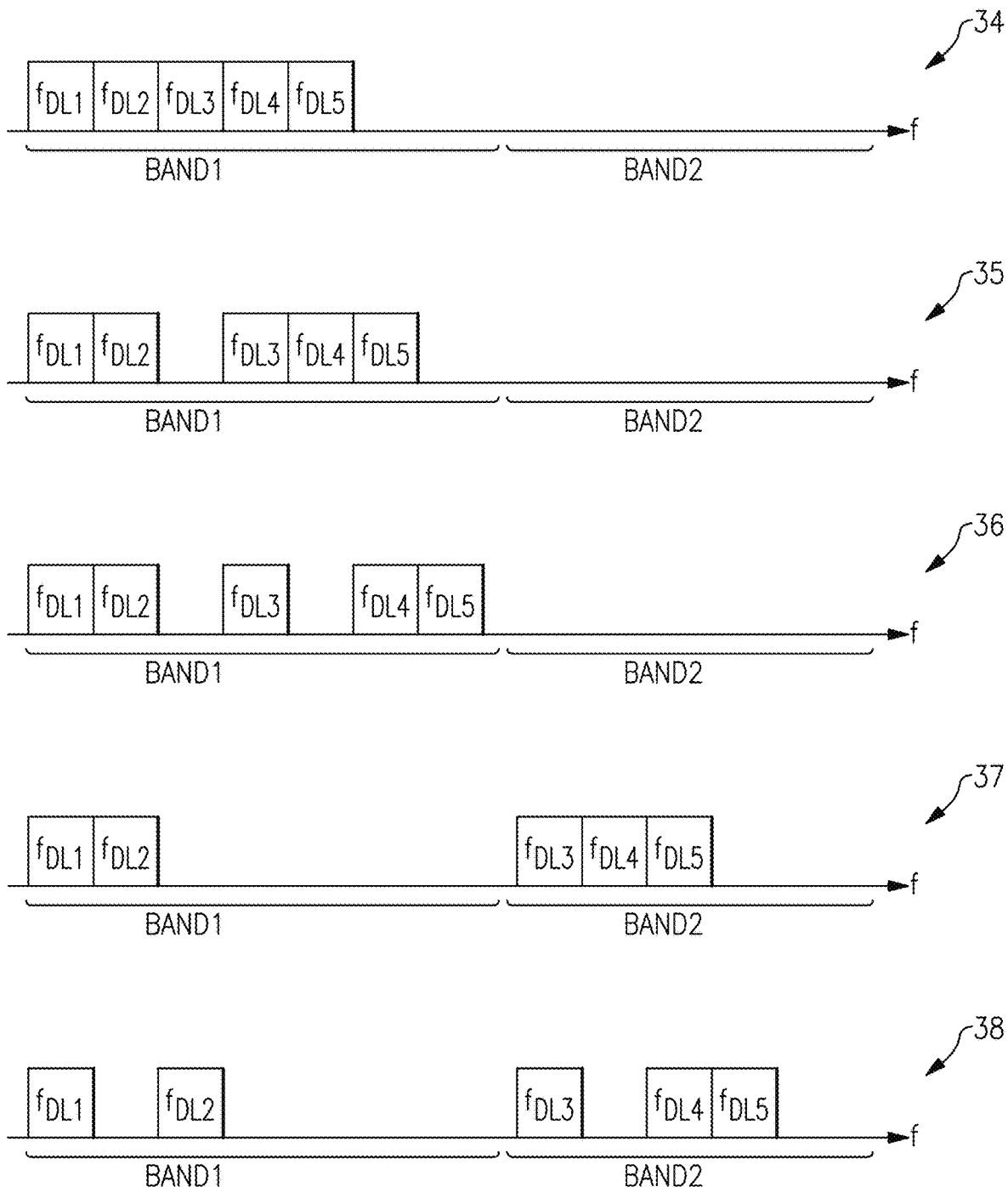
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier $f_{DL1}$, a second component carrier $f_{DL2}$, a third component carrier $f_{DL3}$, a fourth component carrier $f_{DL4}$, and a fifth component carrier $f_{DL5}$. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous, but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and secondary cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as WiFi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid WiFi users and/or to coexist with WiFi users. Enhanced license assisted access (eLAA) refers to an evolution of LAA that aggregates licensed and unlicensed spectrum for both downlink and uplink.

Figure 3A:
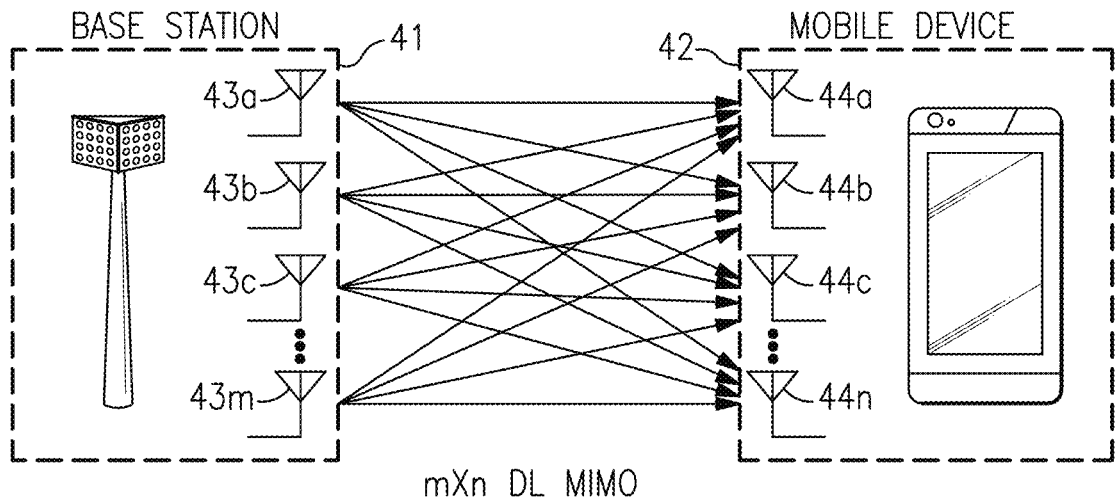
FIG. 3A is a schematic diagram of one example of a downlink channel using multi-input and multi-output (MIMO) communications.
Figure 3B:
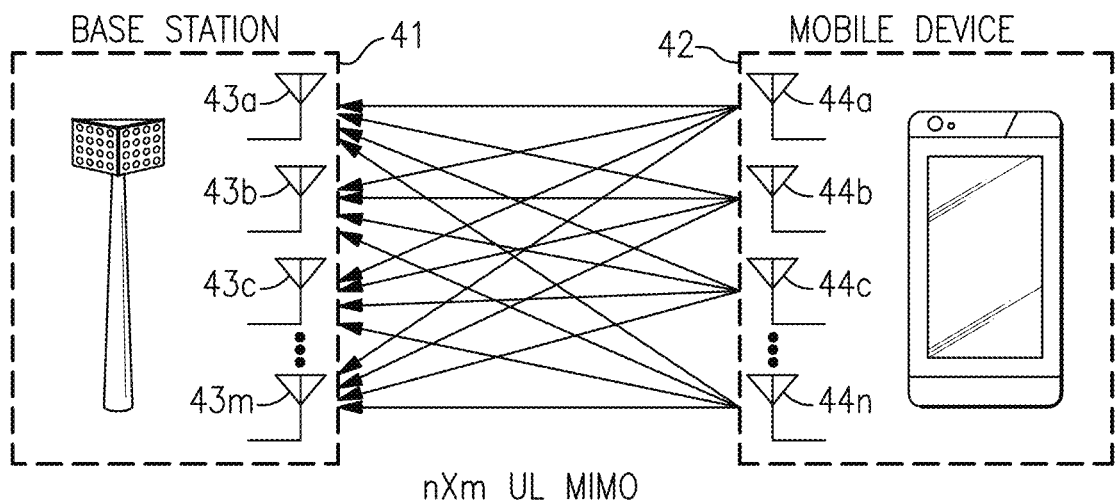
FIG. 3B is schematic diagram of one example of an uplink channel using MIMO communications.

FIG. 3A is a schematic diagram of one example of a downlink channel using multi-input and multi-output (MIMO) communications. FIG. 3B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 3A, downlink MIMO communications are provided by transmitting using M antennas $43a$, $43b$, $43c$, ... $43m$ of the base station $41$ and receiving using N antennas $44a$, $44b$, $44c$, ... $44n$ of the mobile device $42$. Accordingly, FIG. 3A illustrates an example of m×n DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 3B, uplink MIMO communications are provided by transmitting using N antennas $44a$, $44b$, $44c$, ... $44n$ of the mobile device $42$ and receiving using M antennas $43a$, $43b$, $43c$, ... $43m$ of the base station $41$. Accordingly, FIG. 3B illustrates an example of n×m UL MIMO.

By increasing the level or order of MIMO, bandwidth of an uplink channel and/or a downlink channel can be increased.

MIMO communications are applicable to communication links of a variety of types, such as FDD communication links and TDD communication links.

Figure 3C:
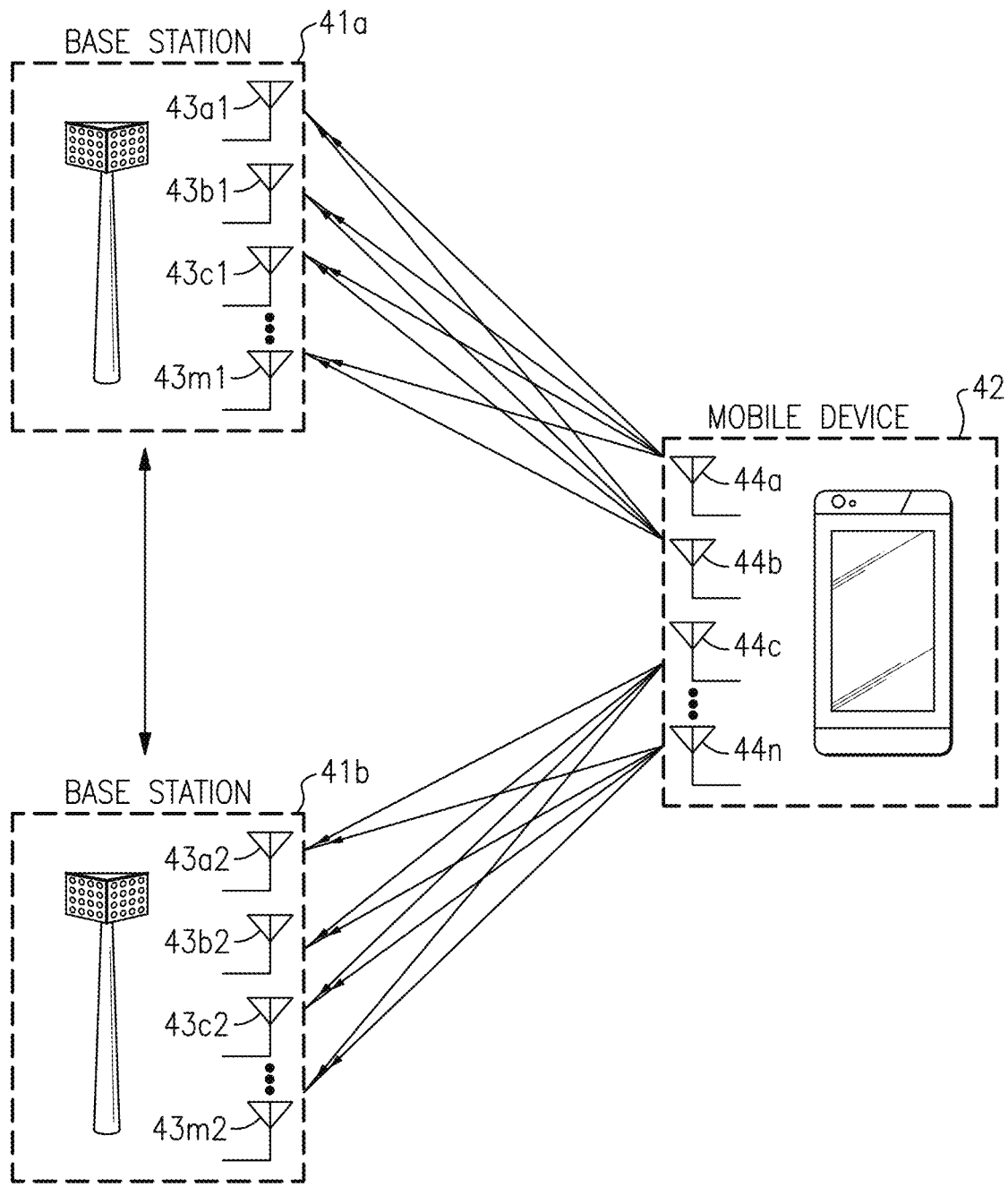
FIG. 3C is schematic diagram of another example of an uplink channel using MIMO communications.

FIG. 3C is schematic diagram of another example of an uplink channel using MIMO communications. In the example shown in FIG. 3C, uplink MIMO communications are provided by transmitting using N antennas $44a$, $44b$, $44c$, ... $44n$ of the mobile device $42$. Additional a first portion of the uplink transmissions are received using M antennas $43a1$, $43b1$, $43c1$, ... $43m1$ of a first base station $41a$, while a second portion of the uplink transmissions are received using M antennas $43a2$, $43b2$, $43c2$, ... $43m2$ of a second base station $41b$. Additionally, the first base station $41a$ and the second base station $41b$ communication with one another over wired, optical, and/or wireless links.

The MIMO scenario of FIG. 3C illustrates an example in which multiple base stations cooperate to facilitate MIMO communications.

With the introduction of the 5G NR air interface standards, 3GPP has allowed for the simultaneous operation of 5G and 4G standards in order to facilitate the transition. This mode can be referred to as Non-Stand-Alone (NSA) operation or E-UTRAN New Radio-Dual Connectivity (EN-DC) and involves both 4G and 5G carriers being simultaneously transmitted from a user equipment (UE).

In certain EN-DC applications, dual connectivity NSA involves overlaying 5G systems onto an existing 4G core network. For dual connectivity in such applications, the control and synchronization between the base station and the UE can be performed by the 4G network while the 5G network is a complementary radio access network tethered to the 4G anchor. The 4G anchor can connect to the existing 4G network with the overlay of 5G data/control.

Figure 4:
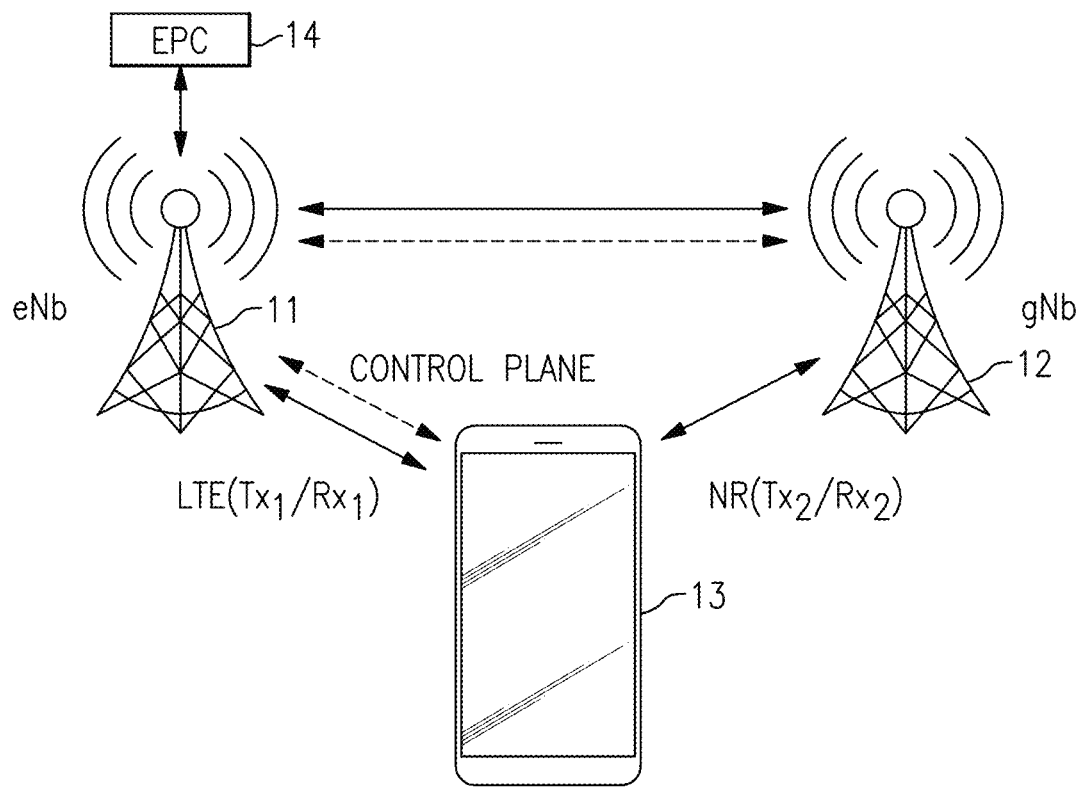
FIG. 4 is a schematic diagram of an example dual connectivity network topology.

FIG. 4 is a schematic diagram of an example dual connectivity network topology. This architecture can leverage LTE legacy coverage to ensure continuity of service delivery and the progressive rollout of 5G cells. A UE $13$ can simultaneously transmit dual uplink LTE and NR carriers. The UE $13$ can transmit an uplink LTE carrier $Tx_1$ to the eNB $11$ while transmitting an uplink NR carrier $Tx_2$ to the gNB $12$ to implement dual connectivity. Any suitable combination of uplink carriers $Tx_1$, $Tx_2$ and/or downlink carriers $Rx_1$, $Rx_2$ can be concurrently transmitted via wireless links in the example network topology. The eNB $11$ can provide a connection with a core network, such as an Evolved Packet Core (EPC) $14$. The gNB $12$ can communicate with the core network via the eNB $11$. Control plane data can be wireless communicated between the UE $13$ and eNB $11$. The eNB $11$ can also communicate control plane data with the gNB $12$. Control plane data can propagate along the paths of the dashed lines in FIG. 4. The solid lines in FIG. 4 are for data plane paths.

In the example dual connectivity topology of FIG. 4, any suitable combinations of standardized bands and radio access technologies (e.g., FDD, TDD, SUL, SDL) can be wirelessly transmitted and received. This can present technical challenges related to having multiple separate radios and bands functioning in the UE $13$. With a TDD LTE anchor point, network operation may be synchronous, in which case the operating modes can be constrained to $Tx_1/Tx_2$ and $Rx_1/Rx_2$, or asynchronous which can involve $Tx_1/Tx_2$, $Tx_1/Rx_2$, $Rx_1/Tx_2$, $Rx_1/Rx_2$. When the LTE anchor is a frequency division duplex (FDD) carrier, the TDD/FDD inter-band operation can involve simultaneous $Tx_1/Rx_1/Tx_2$ and $Tx_1/Rx_1/Rx_2$.

As discussed above, EN-DC can involve both 4G and 5G carriers being simultaneously transmitted from a UE. Transmitting both 4G and 5G carriers in a UE, such as a phone, typically involves two power amplifiers (PAs) being active at the same time. Traditionally, having two power amplifiers active simultaneously would involve the placement of one or more additional power amplifiers specifically suited for EN-DC operation. Additional board space and expense is incurred when designing to support such EN-DC/NSA operation.

Examples of Power Amplifier Supply Control Architectures for Cellular UE

A radio frequency (RF) communication device can include multiple antennas for supporting wireless communications. Additionally, the RF communication device can include a radio frequency front-end (RFFE) system for processing signals received from and transmitted by the antennas. The RFFE system can provide a number of functions, including, but not limited to, signal filtering, signal partitioning and combining, controlling component connectivity to the antennas, and/or signal amplification.

RFFE systems can be used to handle RF signals of a wide variety of types, including, but not limited to, wireless local area network (WLAN) signals, Bluetooth signals, and/or cellular signals. RFFE systems are also referred to herein as front-end systems.

RFFE systems can be used to process signals of a wide range of frequencies. For example, certain RFFE systems can operate using one or more low bands (for example, RF signal bands having a frequency content of 1 GHz or less, also referred to herein as LB), one or more mid bands (for example, RF signal bands having a frequency content between 1 GHz and 2.3 GHz, also referred to herein as MB), one or more high bands (for example, RF signal bands having a frequency content between 2.3 GHz and 3 GHz, also referred to herein as HB), and one or more ultrahigh bands (for example, RF signal bands having a frequency content between 3 GHz and 7.125 GHz, also referred to herein as UHB). In certain implementations, modules operate over mid band and high band frequencies (MHB).

RFFE systems can be used in a wide variety of RF communication devices, including, but not limited to, smartphones, base stations, laptops, handsets, wearable electronics, and/or tablets.

An RFFE system can be implemented to support a variety of features that enhance bandwidth and/or other performance characteristics of the RF communication device in which the RFFE system is incorporated.

For example, to support wider bandwidth, an increasing number of uplink carrier aggregation scenarios have been developed to support wider bandwidth. Additionally, the bandwidths for uplink and downlink cannot be arbitrarily sent since there is a minimum uplink bandwidth for maintaining a reliable link supported by the transport layer's ACK/NACK traffic. Thus, in 4G/5G, wideband uplink carrier aggregation should be supported to achieve higher bandwidth for downlink carrier aggregation.

Thus, an RFFE system can be implemented to support both uplink and downlink carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels, for instance up to five carriers. Carrier aggregation includes contiguous aggregation, in which contiguous carriers within the same operating frequency band are aggregated. Carrier aggregation can also be non-contiguous, and can include carriers separated in frequency within a common band or in different bands.

Transition from 4G to 5G is through non-standalone (NSA) operation, rather than directly to full standalone (SA) operation. Current networks operate in 4G and 5G concurrently by communicating with an eNodeB and a gNodeB simultaneously in an EN-DC mode of operation. Thus, 4G and 5G transmitters operate concurrently is such a phone.

To provide such feature support, an RFFE system can be implemented to support EN-DC.

Support for EN-DC can cover a wide range of frequency bands, including using a 4G band in the LB, MHB, HB, or UHB frequency ranges in combination with a 5G band in the LB, MHB, HB, or UHB frequency ranges. Thus, various combinations of EN-DC including, but not limited to, LB-LB EN-DC, MHB-MHB EN-DC, LB-MHB EN-DC, LB-UHB EN-DC, MHB-UHB EN-DC, and UHB-UHB EN-DC, are possible.

Moreover, in certain dual uplink transmission scenarios, it can be desirable to provide flexibility between swapping which antenna transmits a first RF transmit signal (for instance, one of a 4G signal or a 5G signal) on a first side of a phone board assembly and which antenna transmits a second RF transmit signal (for instance, the other of the 4G signal or the 5G signal) on a side of the phone board assembly. To provide such flexibility, an RFFE system can support a transmit swap function to selectively switch which antenna a particular RF transmit signal is transmitted from.

Another technique for increasing uplink capacity is uplink multiple-input multiple-output (MIMO) communications, in which multiple (for instance, two) power amplifiers transmit two different signals simultaneously on the same frequency using different antennas. MIMO communications benefit from higher signal-to-noise ratio, improved coding, and/or reduced signal interference due to spatial multiplexing differences of the radio environment. MIMO order refers to a number of separate data streams sent or received.

Aforementioned multi-transmitter modes of operation combined with increasing number of power amplifiers in a UE has resulted in high number of power management units (PMUs) even though in most cases only two power amplifiers transmit concurrently.

The higher number of PMUs results not only in added cost, but also space on a phone board, which is a precious commodity in a premium UE, in which a cellular function is just one sub-system among many.

Complexity of PMUs is further exacerbated by the type of power amplifier supply voltage generation that is supported. For example, one technique for improving efficiency of a power amplifier is average power tracking (APT), in which a DC-to-DC converter is used to generate a supply voltage for a power amplifier based on the power amplifier's average output power. Another technique for improving efficiency of a power amplifier is envelope tracking (ET), in which a supply voltage of the power amplifier is controlled in relation to the envelope of the RF signal. Thus, when a voltage level of the envelope of the RF signal increases the voltage level of the power amplifier's supply voltage can be increased. Likewise, when the voltage level of the envelope of the RF signal decreases the voltage level of the power amplifier's supply voltage can be decreased to reduce power consumption.

Provided herein are power management architectures for cellular user equipment (UE). For example, power management unit (PMU) configurations are provided to achieve a balance between often conflicting goals. For instance, such a balance can include (i) reducing a number of PMUs to have a lower cost and a smaller size for power management for a given set of EN-DC/uplink CA/MIMO combinations, (ii) selecting a lowest number of PMUs that support all targeted EN-DC/uplink CA/MIMO cases subject to routing limitations and/or (iii) reducing electromagnetic interference (EMI) radiation of ET power supply lines and preventing current-resistance (IR) voltage drop by avoiding supply lines routes between two portions of a phone board assembly.

Figure 5:
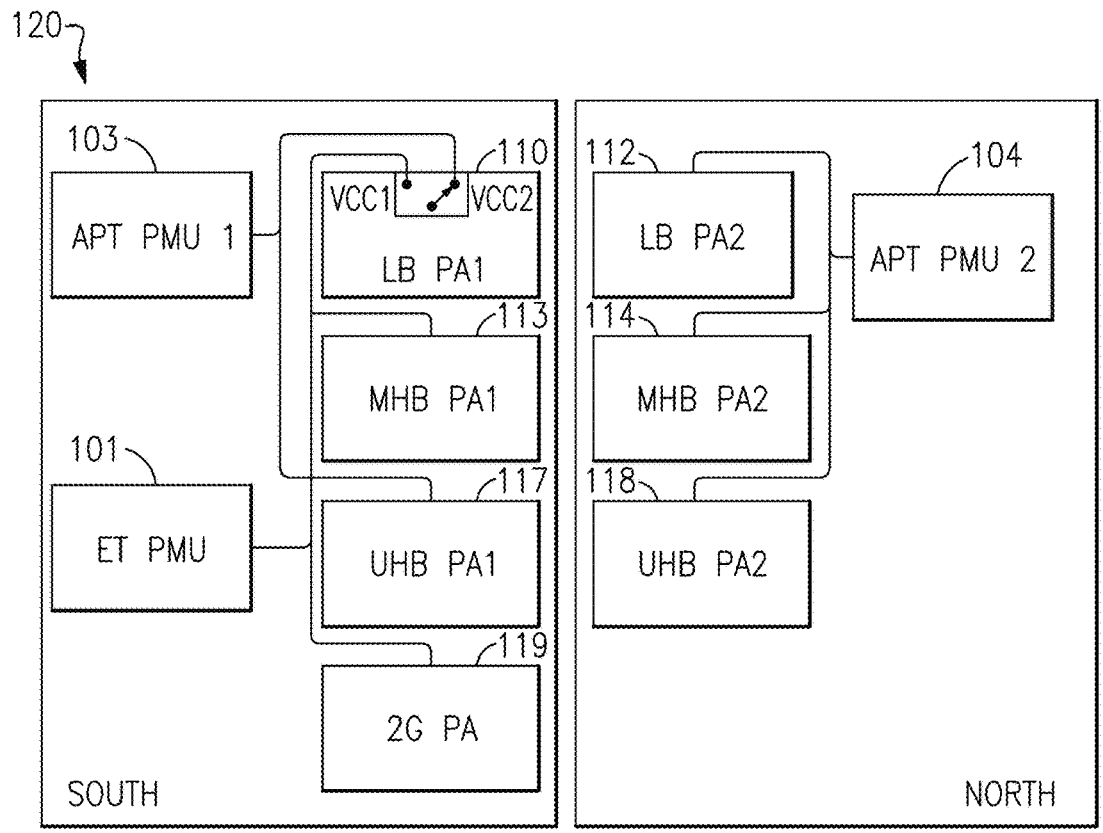
FIG. 5 is a schematic diagram of a phone board assembly according to one embodiment.

FIG. 5 is a schematic diagram of a phone board assembly 120 according to one embodiment. The phone board assembly 120 is for cellular UE (for instance, a mobile phone), and includes a first side (south side or bottom side) and a second side (north side or top side).

In certain implementations herein, a phone board assembly is implemented using two circuit boards, and the first side of the phone board assembly corresponds to a first circuit board and the second side of the phone board assembly corresponds to a second circuit board. However, other implementations are possible, including, for example, configurations using a single circuit board in which the first side corresponds to a first portion (for instance, upper half) and the second side corresponds to a second portion (for instance, lower half).

As shown in FIG. 5, on the south side, a first average power tracking (APT) power management unit (PMU) 103, an envelope tracking (ET) PMU 101, a first low band (LB) power amplifier (PA) module 110, a first mid and high band (MHB) PA module 113, a first UHB PA module 117, and a 2G PA module 119 are included. Additionally, on the north side, a second APT PMU 104, a second LB PA module 112, a second MHB PA module 114, and a second UHB module 118 are included.

In the illustrated embodiment, the first APT PMU 103 provides a first APT supply voltage to the first LB PA module 110 and to the first UHB PA module 117. Additionally, the ET PMU 101 provides an ET supply voltage to the first LB PA module 110, the first MHB PA module 113, and the 2G PA module 119. Furthermore, the second APT PMU 104 provides a second APT supply voltage to the second LB PA module 112, the second MHB PA module 114, and the second UHB PA module 118.

As shown in FIG. 5, the power amplifier supply voltage used by the first LB PA module 110 is switchable between the first APT supply voltage and the ET supply voltage.

Table 1 below depicts the supported operational modes and use of the corresponding PMUs for the phone board assembly 120.

By adding a supply switch to the first LB PA module 110, a number of supply domains (and thus a number of PMUs) can be reduced.

Moreover, the three PMU solution of FIG. 5 supports all modes of a conventional four PMU solution. Moreover, with an additional UHB PA module and a LB PA module on the north side, all operational modes of a premium 2G/4G/5G UE are supported since dual transmit features are supported for these bands.

Furthermore, the LB PA module 110 has access to both ET and APT supply domains. Accordingly, the LB PA module 110 can use the ET supply for a high-power standalone mode and APT in an uplink CA/EN-DC mode in which LB power is lower.

Figure 6:
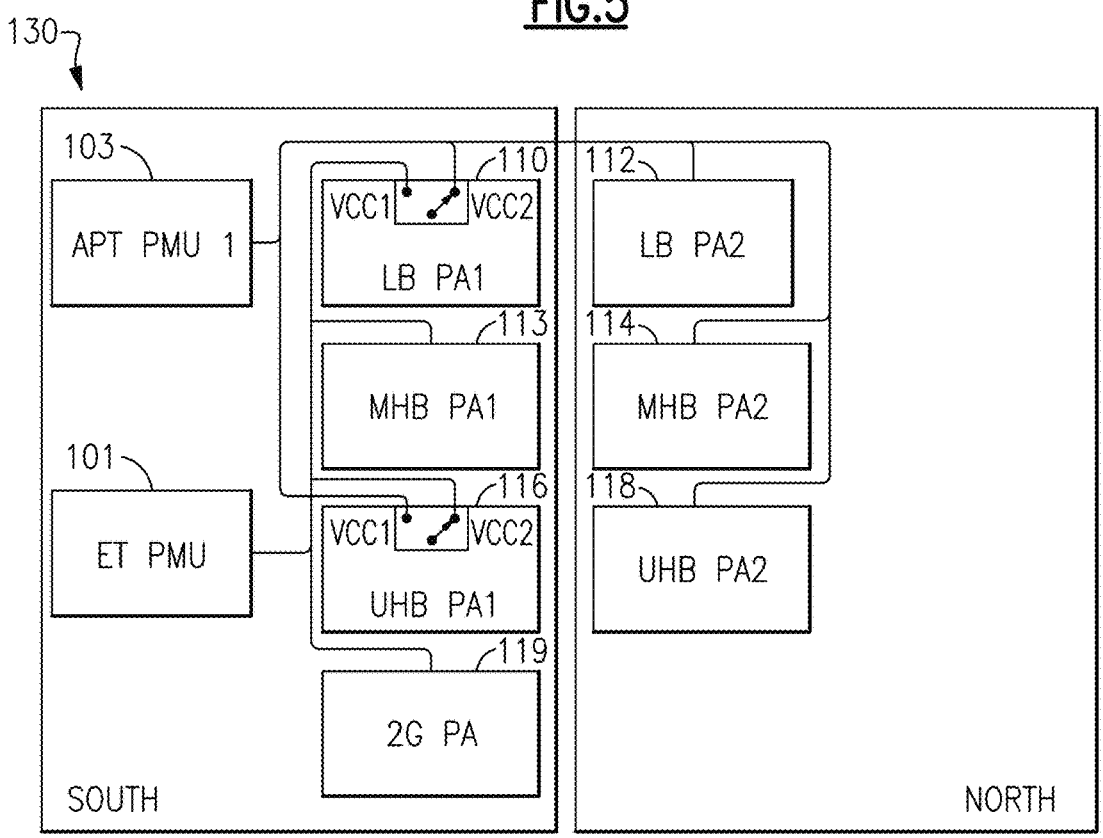
FIG. 6 is a schematic diagram of a phone board assembly according to another embodiment.

FIG. 6 is a schematic diagram of a phone board assembly 130 according to another embodiment. The phone board assembly 130 includes a first side (south side) and a second side (north side). As shown in FIG. 6, on the south side, an APT PMU 103, an ET PMU 101, a first LB PA module 110, a first MHB PA module 113, a first UHB PA module 116, and a 2G PA module 119 are included. Additionally, on the north side, a second LB PA module 112, a second MHB PA module 114, and a second UHB module 118 are included.

In the illustrated embodiment, the APT PMU 103 provides an APT supply voltage to the first UHB PA module 116 and the first LB PA module 110 on the south side. Additionally, the APT supply voltage from the APT PMU 103 on the south side is routed to the north side and provided to the second LB PA module 112, the second MHB PA module 114, and the second UHB PA module 118. The ET PMU 101 provides an ET supply voltage to the first LB PA module 110, the first MHB PA module 113, the first UHB PA module 116, and the 2G PA module 119.

As shown in FIG. 6, the power amplifier supply voltage used by the first LB PA module 110 is switchable between the APT supply voltage and the ET supply voltage. Additionally, the power amplifier supply voltage used by the first UHB PA module 116 is switchable between the APT supply voltage and the ET supply voltage.

Table 2 below depicts the supported operational modes and use of the corresponding PMUs for the phone board assembly 130.

TABLE 1

| | South | | | | North | | |
|---|---|---|---|---|---|---|---|
| Operational Mode | LB PA1 | MHB PA1 | UHB PA | 2G PA | LB PA2 | MHB PA2 | UHB PA2 |
| 2G | | | | ET PMU | | | |
| LB-LB ENDC | ET PMU | | | | APT PMU 2 | | |
| MHB-MHB MIMO/ENDC | | ET PMU | | | | APT PMU 2 | |
| LB-MHB ENDC | APT PMU 1 | ET PMU | | | | | |
| LB-UHB ENDC | ET PMU | | APT PMU 1 | | | | |
| Swap LB-UHB ENDC | ET PMU | | | | | | APT PMU 2 |
| MHB-UHB ENDC | | ET PMU | APT PMU 1 | | | | |
| Swap MHB-UHB ENDC | | ET PMU | | | | | APT PMU 2 |
| UHB-UHB UL MIMO | | | APT PMU 1 | | | | APT PMU 2 |

TABLE 2

| Operational Mode | South | | | | North | | |
|---|---|---|---|---|---|---|---|
| | LB PA1 | MHB PA1 | UHB PA | 2G PA | LB PA2 | MHB PA2 | UHB PA2 |
| 2G | | | | ET PMU | | | |
| LB-LB ENDC | ET PMU | | | | APT PMU | | |
| MHB-MHB MIMO/ENDC | | ET PMU | | | | APT PMU | |
| LB-MHB ENDC | APT PMU | ET PMU | | | | | |
| LB-UHB ENDC | ET PMU | | APT PMU | | | | |
| Swap LB-UHB ENDC | ET PMU | | | | | | APT PMU |
| MHB-UHB ENDC | | ET PMU | APT PMU | | | | |
| Swap MHB-UHB ENDC | | ET PMU | | | | | APT PMU |
| UHB-UHB UL MIMO | | | APT PMU | | | | APT PMU |

By adding a first supply switch to the first LB PA module 110 and a second supply switch to the first UHB PA module 116, a number of supply domains (and thus a number of PMUs) can be reduced. Since the first UHB PA module 116 has access to both ET and APT supply domains, the first UHB PA module 116 can use the ET supply for high-power standalone mode (if desired) and APT in uplink CA/EN-DC mode, when UHB power is lower.

The phone board assembly 130 of FIG. 6 supports all operational modes of a premium 2G/4G/5G UE.

In comparison to the phone board assembly 120 of FIG. 5, the phone board assembly 130 of FIG. 6 includes one less PMU, but also include a south-to-north connection across the phone board assembly 130 and thus is more susceptible to EMI.

Figure 7:
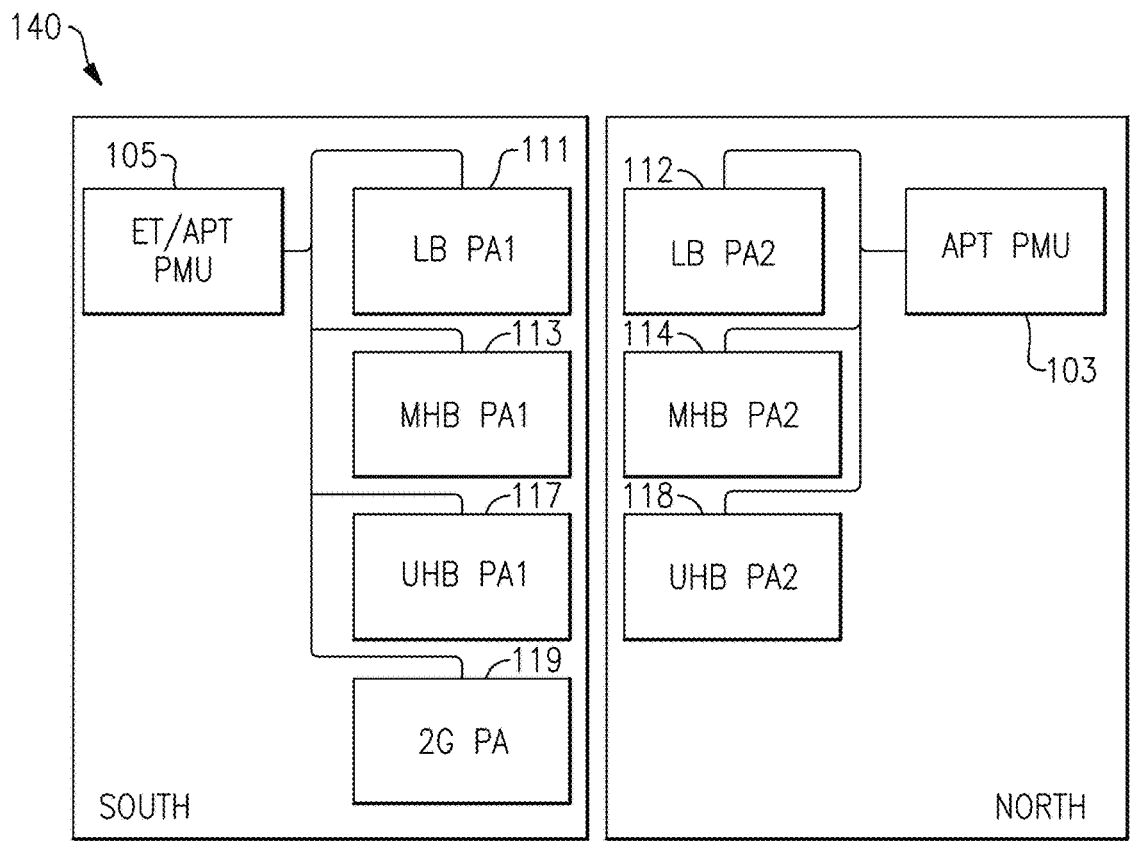
FIG. 7 is a schematic diagram of a phone board assembly according to another embodiment.

FIG. 7 is a schematic diagram of a phone board assembly 140 according to another embodiment. The phone board assembly 140 includes a first side (south side) and a second side (north side). As shown in FIG. 7, on the south side, an ET/APT PMU 105, a first LB PA module 111, a first MHB PA module 113, a first UHB PA module 117, and a 2G PA module 119 are included. Additionally, on the north side, an APT PMU 103, a second LB PA module 112, a second MHB PA module 114, and a second UHB module 118 are included.

In the illustrated embodiment, the ET/APT PMU 105 provides an ET/APT supply voltage to the first LB PA module 111, the first MHB PA module 113, the first UHB PA module 117, and the 2G PA module 119. Additionally, the APT PMU 103 provides an APT supply voltage to the second LB PA module 112, the second MHB PA module 114, and the second UHB PA module 118.

Table 3 below depicts the supported operational modes and use of the corresponding PMUs for the phone board assembly 140.

TABLE 3

| Operational Mode | South | | | | North | | |
|---|---|---|---|---|---|---|---|
| | LB PA1 | MHB PA1 | UHB PA | 2G PA | LB PA2 | MHB PA2 | UHB PA2 |
| 2G | | | | ET/APT PMU | | | |
| LB-LB ENDC | ET/APT PMU | | | | APT PMU | | |
| MHB-MHB MIMO/ENDC | | ET PMU | | | | APT PMU | |
| LB-MHB ENDC | ET/APT PMU | | | | | APT PMU | |
| LB-UHB ENDC | ET/APT PMU | | | | | | APT PMU |
| Swap LB-UHB ENDC | | | ET/APT PMU | | APT PMU | | |
| MHB-UHB ENDC | | ET/APT PMU | | | | | APT PMU |
| Swap MHB-UHB ENDC | | | ET/APT PMU | | | APT PMU | |
| UHB-UHB UL MIMO | | | ET/APT PMU | | | | APT PMU |

With respect to the phone board assembly 140 of FIG. 7, EMI and IR drop concerns are alleviated since no power supply lines need to cross boundaries between the two sides of the phone board assembly 140.

In this example, all PAs on the north side of the phone board assembly 140 are APT type and are supportable by a single APT PMU, while PAs on the south side are a mix of APT and ET, and a single dual-mode PMU can support them. Since a dual mode supply PMU is larger than an ET-alone PMU, the power management solution for the phone board assembly 140 of FIG. 7 is larger than that of the phone board assembly 130 of FIG. 6.

The phone board assembly 140 of FIG. 7 supports all operational modes of a premium 2G/4G/5G UE.

Figure 8:
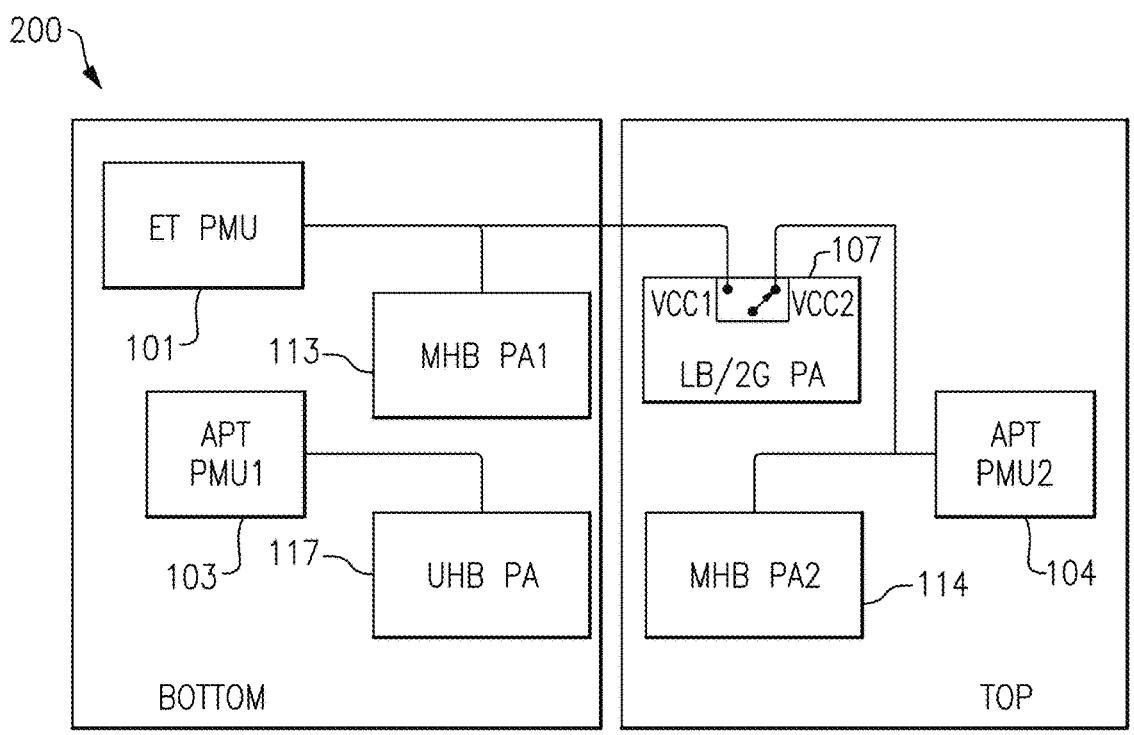
FIG. 8 is a schematic diagram of a phone board assembly according to another embodiment.
Figure 9:
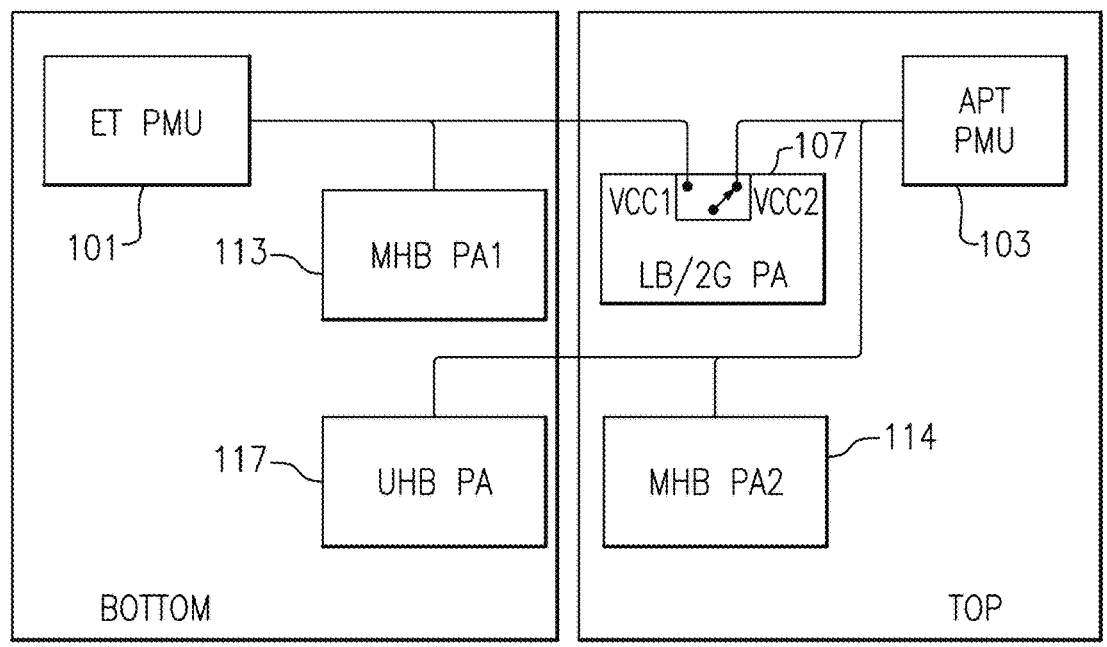
FIG. 9 is a schematic diagram of a phone board assembly according to another embodiment.
Figure 10:
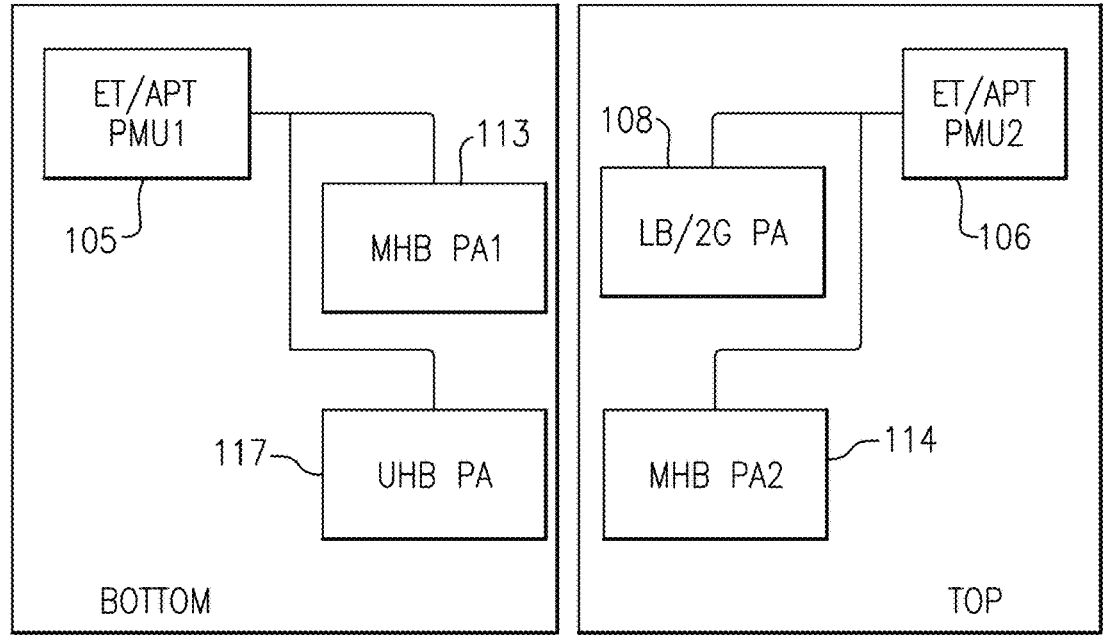
FIG. 10 is a schematic diagram of a phone board assembly according to another embodiment.

With reference to FIGS. 8-10, the depicted power management architectures are directed toward mid-tier UE, which do not support UL MIMO, LB-LB EN-DC, or swapping between transmitters on opposite sides of the phone board assembly. Thus, complexity of such front-end systems (for instance, a number of power amplifier modules) is reduced.

FIG. 8 is a schematic diagram of a phone board assembly 200 according to another embodiment. The phone board assembly 200 includes a first side (bottom side) and a second side (top side). As shown in FIG. 8, on the bottom side, a first APT PMU 103, an ET PMU 101, a first MHB PA module 113, and a UHB PA module 117 are included. Additionally, on the top side, a second APT PMU 104, a second MHB PA module 114, and a LB/2G PA module 107 are included.

In the illustrated embodiment, the ET PMU provides an ET supply voltage to the first MHB PA module 113 on the bottom side and to the LB/2G PA module 107 on the top side. Additionally, the first APT PMU 103 provides a first APT supply voltage to the UHB PA module 117. Furthermore, the second APT PMU 104 provides a second APT supply voltage to the LB/2G PA module 107 and to the second MHB PA module 114.

As shown in FIG. 8, the power amplifier supply voltage used by the LB/2G PA module is switchable between the second APT supply voltage and the ET supply voltage.

Table 4 below depicts the supported operational modes and use of the corresponding PMUs for the phone board assembly 200.

TABLE 4

| Operational Mode | Bottom | | Top | |
| --- | --- | --- | --- | --- |
| | UHB PA | MHB PA1 | LB/2G PA | MHB PA2 |
| 2G | | | ET PMU | |
| MHB-MHB ENDC | | ET PMU | | APT PMU2 |
| LB-MHB ENDC | | ET PMU | APT PMU2 | |
| LB-UHB ENDC | APT PMU1 | | APT PMU2 | |
| MHB-UHB ENDC | APT PMU1 | ET PMU | | |

By adding a supply voltage switch to the LB/2G PA module 107, the number of PMUs is reduced. Additionally, the LB/2G PA module 107 has access to both ET and APT supply domains, and thus can use the ET supply for high-power standalone mode (if desired) and APT in an uplink CA/EN-DC mode, when LB power is lower. Furthermore, all mid-tier operational modes are supported. However, the power management solution uses a top-to-bottom supply line on the phone board assembly 200, and thus is more susceptible to EMI.

FIG. 9 is a schematic diagram of a phone board assembly 210 according to another embodiment. The phone board assembly 210 includes a first side (bottom side) and a second side (top side). As shown in FIG. 9, on the bottom side, an ET PMU 101, a first MHB PA module 113, and a UHB PA module 117 are included. Additionally, on the top side, an APT PMU 103, a second MHB PA module 114, and a LB/2G PA module 107 are included.

In the illustrated embodiment, the ET PMU 101 provides an ET supply voltage to the first MHB PA module 113 on the bottom side and to the LB/2G PA module 107 on the top side. Additionally, the APT PMU 103 provides an APT supply voltage to the UHB PA module 117 on the bottom side and to the LB/2G PA module 107 and the second MHB PA module 114 on the top side.

As shown in FIG. 9, the power amplifier supply voltage used by the LB/2G PA module 107 is switchable between the APT supply voltage and the ET supply voltage.

Table 5 below depicts the supported operational modes and use of the corresponding PMUs for the phone board assembly 210.

TABLE 5

| Operational Mode | Bottom | | Top | |
| --- | --- | --- | --- | --- |
| | UHB PA | MHB PA1 | LB/2G PA | MHB PA2 |
| 2G | | | ET PMU | |
| MHB-MHB ENDC | | ET PMU | | APT PMU |
| LB-MHB ENDC | | ET PMU | APT PMU | |
| LB-UHB ENDC | APT PMU | | ET PMU | |
| MHB-UHB ENDC | APT PMU | ET PMU | | |

By adding a supply voltage switch to the LB/2G PA module 107, the number of PMUs is reduced. Additionally, the LB/2G PA module 107 has access to both ET and APT supply domains, and thus can use the ET supply for high-power standalone mode (if desired) and APT in an uplink CA/EN-DC mode, when LB power is lower. Furthermore, all mid-tier operational modes are supported. However, the power management solution uses a top-to-bottom supply line on the phone board assembly 210, and thus is more susceptible to EMI.

FIG. 10 is a schematic diagram of a phone board assembly 220 according to another embodiment. The phone board assembly 220 includes a first side (bottom side) and a second side (top side). As shown in FIG. 10, on the bottom side, a first ET/APT PMU 105, a first MHB PA module 113, and a UHB PA module 117 are included. Additionally, on the top side, a second ET/APT PMU 106, a second MHB PA module 114, and a LB/2G PA module 108 are included.

In the illustrated embodiment, the first ET/APT PMU 105 provides a first ET/APT supply voltage to the first MHB PA module 113 and to the UHB PA module 117. Additionally, the second ET/APT PMU 106 provides a second APT supply voltage to the LB/2G PA module 108 and to the second MHB PA module 114.

Table 6 below depicts the supported operational modes and use of the corresponding PMUs for the phone board assembly 220.

TABLE 6

| Operational Mode | Bottom | | Top | |
| --- | --- | --- | --- | --- |
| | UHB PA | MHB PA1 | LB/2G PA | MHB PA2 |
| 2G | | | ET/APT PMU2 | |
| MHB-MHB ENDC | | ET/APT PMU1 | | ET/APT PMU2 |
| LB-MHB ENDC | | ET/APT PMU1 | ET/APT PMU2 | |
| LB-UHB ENDC | ET/APT PMU1 | | ET/APT PMU2 | |
| MHB-UHB ENDC | ET/APT PMU1 | | | ET/APT PMU2 |

Since no power supply lines cross boundaries between the two sides of the phone board assembly 220, EMI and IR drop concerns can be alleviated. However, since a dual mode supply PMU is larger than an ET-alone PMU, the power management solution for the phone board assembly 220 of FIG. 10 is larger than that of the phone board assembly 210 of FIG. 9.

Figure 11:
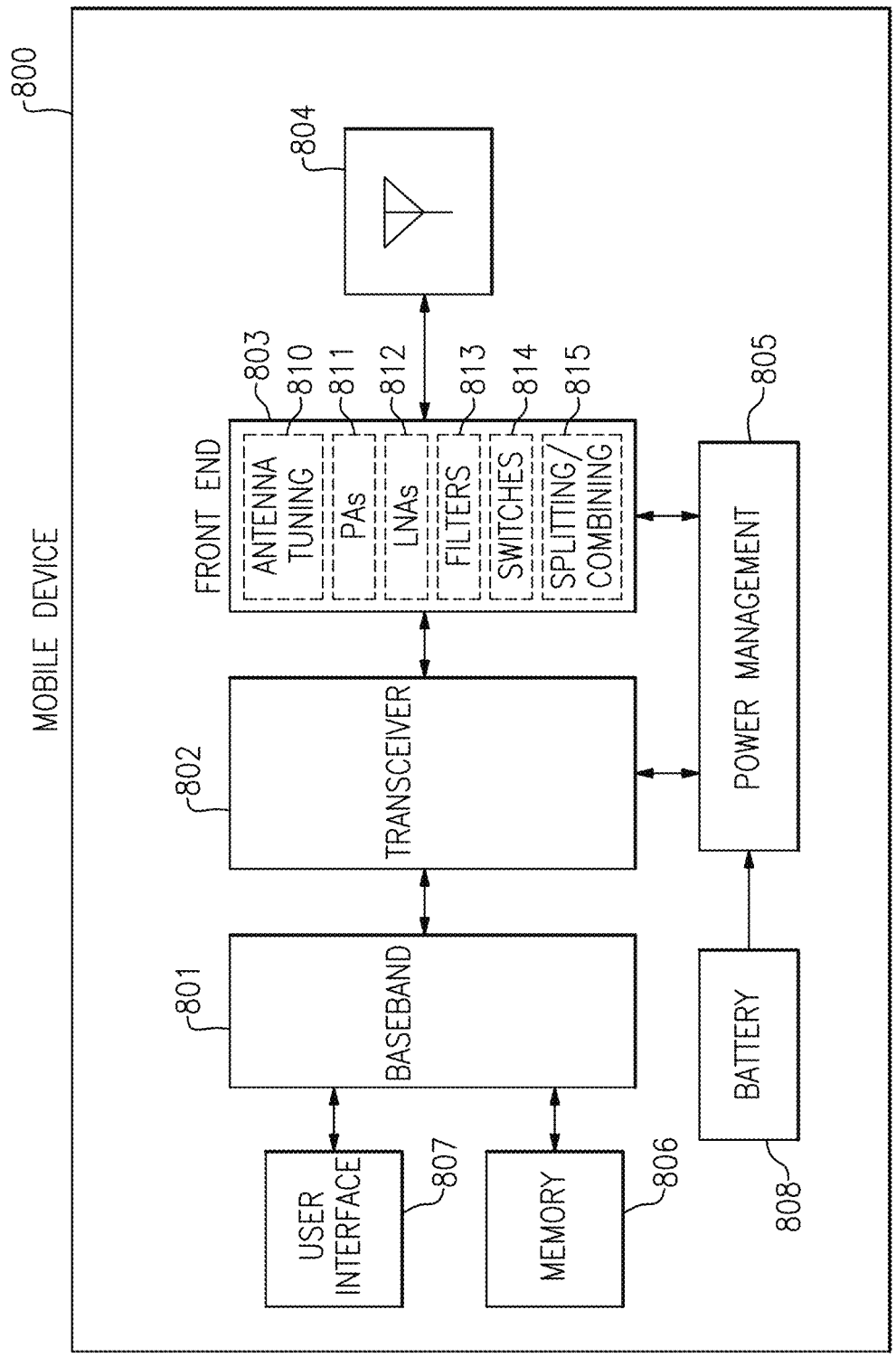
FIG. 11 is a schematic diagram of one embodiment of a mobile device.

FIG. 11 is a schematic diagram of one embodiment of a mobile device 800. The mobile device 800 includes a baseband system 801, a transceiver 802, a front-end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 11 as the transceiver 802. In one example, separate components (for instance, separate circuits or dies) can be provided for handling certain types of RF signals.

The front-end system 803 aids in conditioning signals transmitted to and/or received from the antennas 804. In the illustrated embodiment, the front-end system 803 includes antenna tuning circuitry 810, power amplifiers (PAs) 811, low noise amplifiers (LNAs) 812, filters 813, switches 814, and signal splitting/combining circuitry 815. However, other implementations are possible.

For example, the front-end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front-end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 11, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE). The power management system 805 can include PMUs implemented in accordance with the teachings herein. Thus, the power management system 805 can be implemented in accordance with any of the embodiments herein, and serves as a power management sub-system for UE.

As shown in FIG. 11, the power management system 805 receives a battery voltage from the battery 808. The battery 808 can be any suitable battery for use in the mobile device 800, including, for example, a lithium-ion battery.

Figure 12:
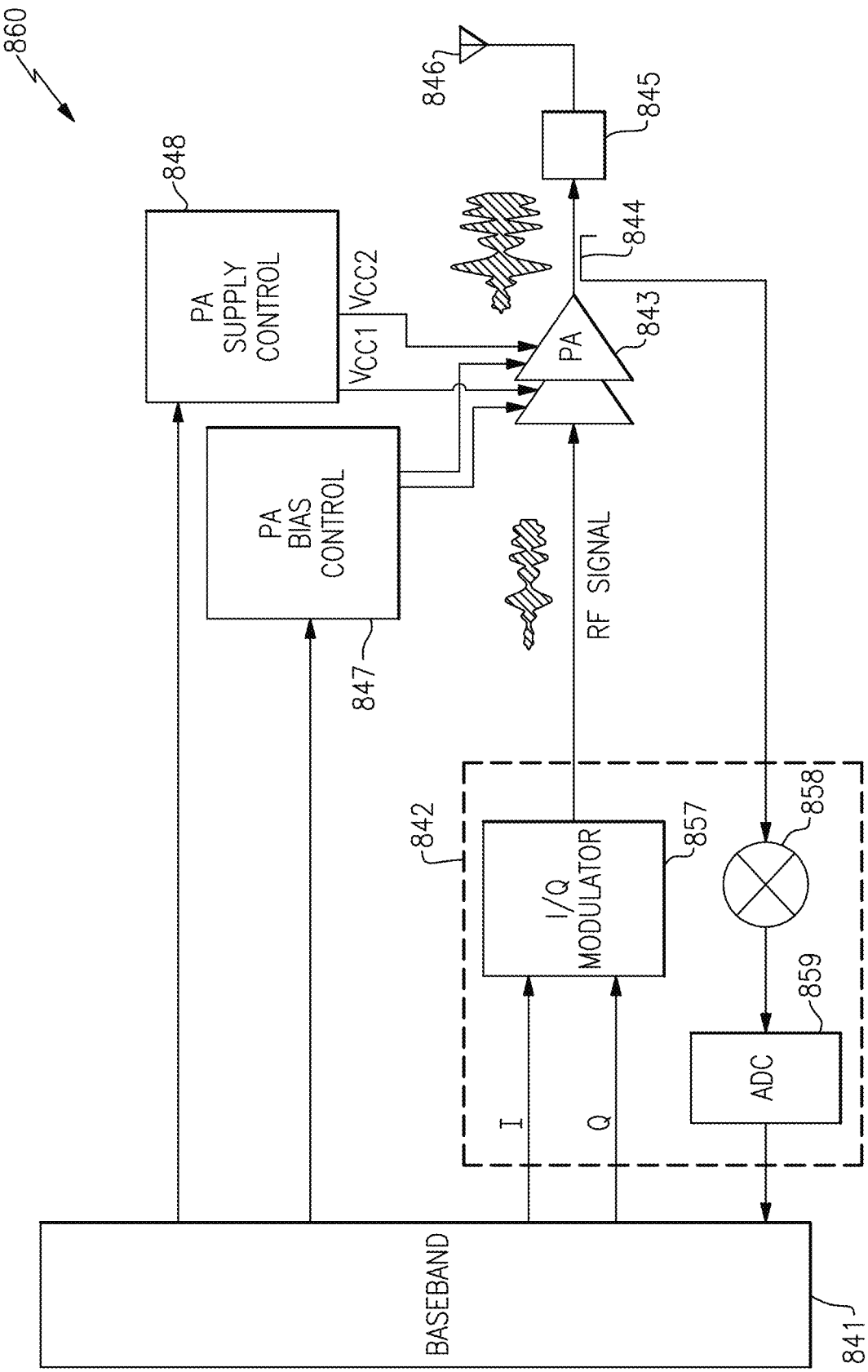
FIG. 12 is a schematic diagram of a power amplifier system according to one embodiment.

FIG. 12 is a schematic diagram of a power amplifier system 860 according to one embodiment. The illustrated power amplifier system 860 includes a baseband processor 841, a transmitter/observation receiver 842, a power amplifier (PA) 843, a directional coupler 844, front-end circuitry 845, an antenna 846, a PA bias control circuit 847, and a PA supply control circuit 848. The illustrated transmitter/observation receiver 842 includes an I/Q modulator 857, a mixer 858, and an analog-to-digital converter (ADC) 859. In certain implementations, the transmitter/observation receiver 842 is incorporated into a transceiver.

The baseband processor 841 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals can be provided to the I/Q modulator 857 in a digital format. The baseband processor 841 can be any suitable processor configured to process a baseband signal. For instance, the baseband processor 841 can include a digital signal processor, a microprocessor, a programmable core, or any combination thereof. Moreover, in some implementations, two or more baseband processors 841 can be included in the power amplifier system 860.

The I/Q modulator 857 can be configured to receive the I and Q signals from the baseband processor 841 and to process the I and Q signals to generate an RF signal. For example, the I/Q modulator 857 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the power amplifier 843. In certain implementations, the I/Q modulator 857 can include one or more filters configured to filter frequency content of signals processed therein.

The power amplifier 843 can receive the RF signal from the I/Q modulator 857, and when enabled can provide an amplified RF signal to the antenna 846 via the front-end circuitry 845.

The front-end circuitry 845 can be implemented in a wide variety of ways. In one example, the front-end circuitry 845 includes one or more switches, filters, duplexers, multiplexers, and/or other components. In another example, the front-end circuitry 845 is omitted in favor of the power amplifier 843 providing the amplified RF signal directly to the antenna 846.

The directional coupler 844 senses an output signal of the power amplifier 823. Additionally, the sensed output signal from the directional coupler 844 is provided to the mixer 858, which multiplies the sensed output signal by a reference signal of a controlled frequency. The mixer 858 operates to generate a downshifted signal by downshifting the sensed output signal's frequency content. The downshifted signal can be provided to the ADC 859, which can convert the downshifted signal to a digital format suitable for processing by the baseband processor 841. Including a feedback path from the output of the power amplifier 843 to the baseband processor 841 can provide a number of advantages. For example, implementing the baseband processor 841 in this manner can aid in providing power control, compensating for transmitter impairments, and/or in performing digital pre-distortion (DPD). Although one example of a sensing path for a power amplifier is shown, other implementations are possible.

The PA supply control circuit 848 receives a power control signal from the baseband processor 841, and controls supply voltages of the power amplifier 843. In the illustrated configuration, the PA supply control circuit 848 generates a first supply voltage $V_{CC1}$ for powering an input stage of the power amplifier 843 and a second supply voltage $V_{CC2}$ for powering an output stage of the power amplifier 843. The PA supply control circuit 848 can control the voltage level of the first supply voltage $V_{CC1}$ and/or the second supply voltage $V_{CC2}$ to enhance the power amplifier system's PAE.

The PA supply control circuit 848 can employ various power management techniques to change the voltage level of one or more of the supply voltages over time to improve the power amplifier's power added efficiency (PAE), thereby reducing power dissipation.

One technique for improving efficiency of a power amplifier is average power tracking (APT), in which a DC-to-DC converter is used to generate a supply voltage for a power amplifier based on the power amplifier's average output power. Another technique for improving efficiency of a power amplifier is envelope tracking (ET), in which a supply voltage of the power amplifier is controlled in relation to the envelope of the RF signal. Thus, when a voltage level of the envelope of the RF signal increases the voltage level of the power amplifier's supply voltage can be increased. Likewise, when the voltage level of the envelope of the RF signal decreases the voltage level of the power amplifier's supply voltage can be decreased to reduce power consumption.

In certain configurations, the PA supply control circuit 848 is a multi-mode supply control circuit that can operate in multiple supply control modes including an APT mode and an ET mode. For example, the power control signal from the baseband processor 841 can instruct the PA supply control circuit 848 to operate in a particular supply control mode.

As shown in FIG. 12, the PA bias control circuit 847 receives a bias control signal from the baseband processor 841, and generates bias control signals for the power amplifier 843. In the illustrated configuration, the bias control circuit 847 generates bias control signals for both an input stage of the power amplifier 843 and an output stage of the power amplifier 843. However, other implementations are possible.

Figure 13:
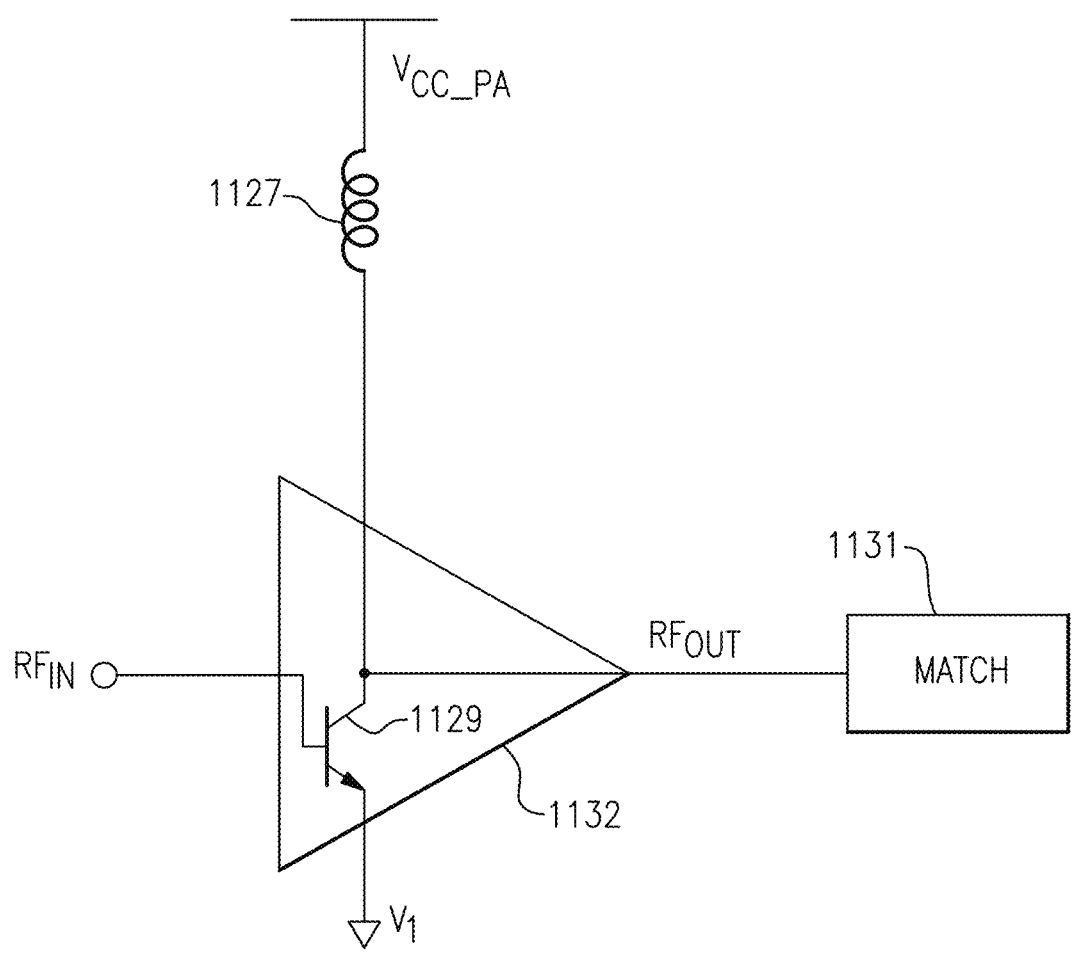
FIG. 13 is a schematic diagram of one example of a power amplifier powered by a power amplifier supply voltage.

FIG. 13 is a schematic diagram of one example of a power amplifier 1132 powered by a power amplifier supply voltage $V_{CC\_PA}$. As shown in FIG. 13, an inductor 1127 is used to provide the power amplifier supply voltage $V_{CC\_PA}$ from a PMU to the power amplifier 1132, which is terminated using an output impedance matching circuit 1131.

The illustrated power amplifier 1132 includes a bipolar transistor 1129 having an emitter, a base, and a collector. As shown in FIG. 13, the emitter of the bipolar transistor 1129 is electrically connected to a power low supply voltage $V_1$, which can be, for example, a ground supply. Additionally, an RF signal ($RF_{IN}$) is provided to the base of the bipolar transistor 1129, and the bipolar transistor 1129 amplifies the RF signal to generate an amplified RF signal at the collector. The bipolar transistor 1129 can be any suitable device. In one implementation, the bipolar transistor 1129 is a heterojunction bipolar transistor (HBT).

The output impedance matching circuit 1131 serves to terminate the output of the power amplifier 1132, which can aid in increasing power transfer and/or reducing reflections of the amplified RF signal generated by the power amplifier 1132. In certain implementations, the output impedance matching circuit 1131 further operates to provide harmonic termination and/or to control a load line impedance of the power amplifier 1132.

The inductor 1127 can be included to provide the power amplifier 1132 with the power amplifier supply voltage $V_{CC\_PA}$ while choking or blocking high frequency RF signal components. The inductor 1127 can include a first end electrically connected to the envelope tracker 1102, and a second end electrically connected to the collector of the bipolar transistor 1129. In certain implementations, the inductor 1127 operates in combination with the impedance matching circuit 1131 to provide output matching.

Although FIG. 13 illustrates one implementation of the power amplifier 1132, skilled artisans will appreciate that the teachings described herein can be applied to a variety of power amplifier structures, such as multi-stage power amplifiers and power amplifiers employing other transistor structures. For example, in some implementations the bipolar transistor 1129 can be omitted in favor of employing a field-effect transistor (FET), such as a silicon FET, a gallium arsenide (GaAs) high electron mobility transistor (HEMT), or a laterally diffused metal oxide semiconductor (LDMOS) transistor. Additionally, the power amplifier 1132 can be adapted to include additional circuitry, such as biasing circuitry.

Figure 14A:
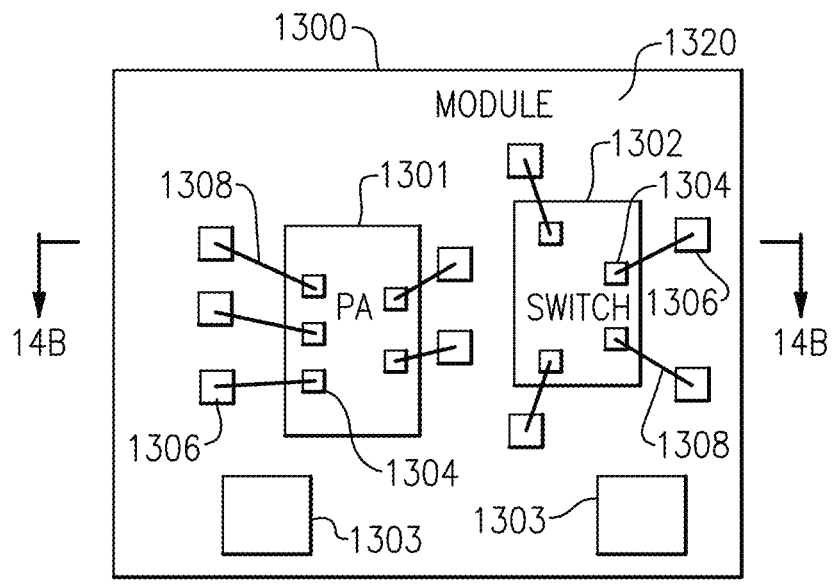
FIG. 14A is a schematic diagram of one embodiment of a packaged module.
Figure 14B:
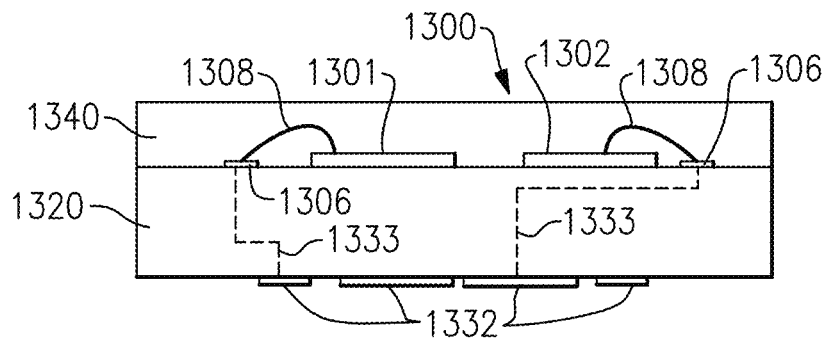
FIG. 14B is a schematic diagram of a cross-section of the packaged module of FIG. 14A taken along the lines 14B-14B.

FIG. 14A is a schematic diagram of one embodiment of a packaged module 1300. FIG. 14B is a schematic diagram of a cross-section of the packaged module 1300 of FIG. 14A taken along the lines 14B-14B.

The packaged module 1300 includes a power amplifier die 1301, a supply switch die 1302, surface mount components 1303, wirebonds 1308, a package substrate 1320, and encapsulation structure 1340. The package substrate 1320 includes pads 1306 formed from conductors disposed therein. Additionally, the dies 1301, 1302 include pads 1304, and the wirebonds 1308 have been used to connect the pads 1304 of the dies 1301, 1302 to the pads 1306 of the package substrate 1320.

The power amplifier die 1301 and the supply switch die 1302 are implemented in accordance with one or more features of the present disclosure. In certain implementations, the supply switch die 1302 provides a selected power amplifier supply voltage to the power amplifier die 1301.

In certain implementations, the dies 1301, 1302 are manufactured using different processing technologies. In one example, the power amplifier die 1301 is manufactured using a heterojunction bipolar transistor (HBT) process, and the supply switch die 1302 is manufactured using a silicon process.

The packaging substrate 1320 can be configured to receive a plurality of components such as the dies 1301, 1302 and the surface mount components 1303, which can include, for example, surface mount capacitors and/or inductors.

As shown in FIG. 14B, the packaged module 1300 is shown to include a plurality of contact pads 1332 disposed on the side of the packaged module 1300 opposite the side used to mount the dies 1301, 1302. Configuring the packaged module 1300 in this manner can aid in connecting the packaged module 1300 to a circuit board such as a phone board of a wireless device. The example contact pads 1332 can be configured to provide RF signals, bias signals, power low voltage(s) and/or power high voltage(s) to the dies 1301, 1302 and/or the surface mount components 1303. As shown in FIG. 14B, the electrically connections between the contact pads 1332 and the die 1301 can be facilitated by connections 1333 through the package substrate 1320. The connections 1333 can represent electrical paths formed through the package substrate 1320, such as connections associated with vias and conductors of a multilayer laminated package substrate.

In some embodiments, the packaged module 1300 can also include one or more packaging structures to, for example, provide protection and/or facilitate handling of the packaged module 1300. Such a packaging structure can include overmold or encapsulation structure 1340 formed over the packaging substrate 1320 and the components and die(s) disposed thereon.

It will be understood that although the packaged module 1300 is described in the context of electrical connections based on wirebonds, one or more features of the present disclosure can also be implemented in other packaging configurations, including, for example, flip-chip configurations.

Figure 15A:
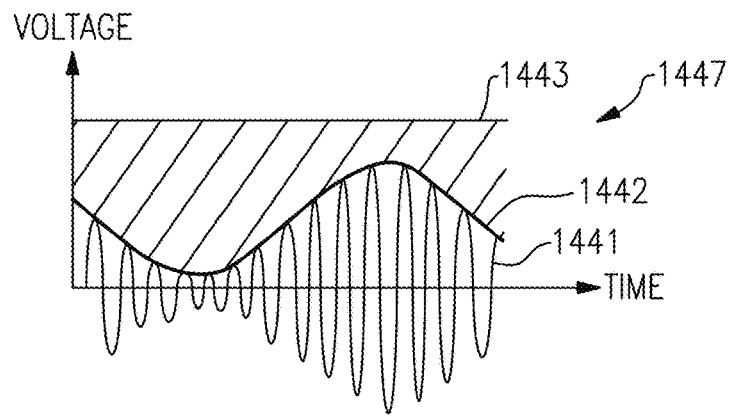
FIG. 15A is a graph showing a first example of power amplifier supply voltage versus time.

FIG. 15A is a graph 1447 showing a first example of power amplifier supply voltage versus time. The graph 1447 illustrates the voltage of an RF signal 1441, the RF signal's envelope 1442, and a power amplifier supply voltage 1443 versus time. The graph 1447 corresponds to one example of waveforms for an implementation in which the power amplifier supply voltage 1443 is substantially fixed (DC).

It can be important that the power amplifier supply voltage 1443 of a power amplifier has a voltage greater than that of the RF signal 1441. For example, powering a power amplifier using a power amplifier supply voltage that has a magnitude less than that of the RF signal can clip the RF signal, thereby creating signal distortion and/or other problems. Thus, it can be important the power amplifier supply voltage 1443 be greater than that of the envelope 1442. However, it can be desirable to reduce a difference in voltage between the power amplifier supply voltage 1443 and the envelope 1442 of the RF signal 1441, as the area between the power amplifier supply voltage 1443 and the envelope 1442 can represent lost energy, which can reduce battery life and increase heat generated in a wireless device.

Figure 15B:
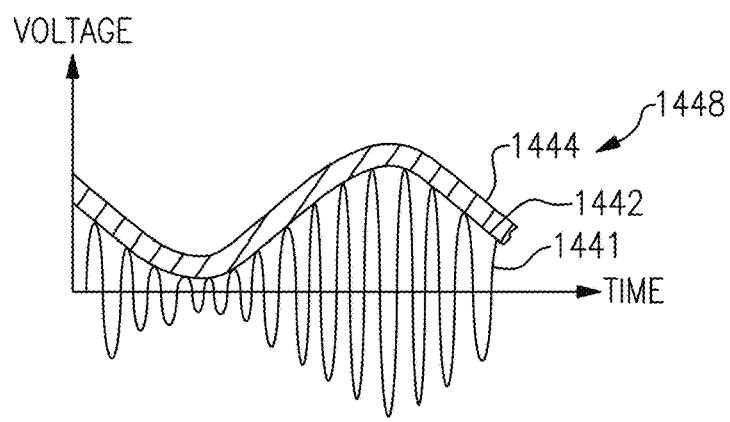
FIG. 15B is a graph showing a second example of power amplifier supply voltage versus time.

FIG. 15B is a graph 1448 showing a second example of power amplifier supply voltage versus time. The graph 1448 illustrates the voltage of an RF signal 1441, the RF signal's envelope 1442, and a power amplifier supply voltage 1444 versus time. The graph 48 corresponds to one example of waveforms for an implementation in which the power amplifier supply voltage 1444 is generated by envelope tracking.

Envelope tracking is a technique that can be used to increase power added efficiency (PAE) of a power amplifier system by efficiently controlling a voltage level of a power amplifier supply voltage in relation to an envelope of the RF signal amplified by the power amplifier. Thus, when the envelope of the RF signal increases, the voltage supplied to the power amplifier can be increased. Likewise, when the envelope of the RF signal decreases, the voltage supplied to the power amplifier can be decreased to reduce power consumption.

In contrast to the power amplifier supply voltage 1443 of FIG. 15A, the power amplifier supply voltage 1444 of FIG. 15B changes in relation to the envelope 1442 of the RF signal 1441. The area between the power amplifier supply voltage 1444 and the envelope 1442 in FIG. 15B is less than the area between the power amplifier supply voltage 1443 and the envelope 1442 in FIG. 15A, and thus the graph 1448 of FIG. 15B can be associated with a power amplifier system having greater energy efficiency.

Figure 15C:
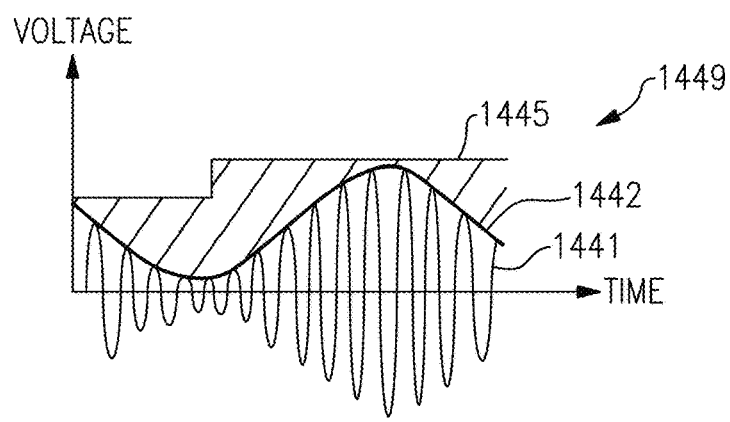
FIG. 15C is a graph showing a third example of power amplifier supply voltage versus time.

FIG. 15C is a graph 1449 showing a third example of power amplifier supply voltage versus time. The graph 1449 illustrates the voltage of an RF signal 1441, the RF signal's envelope 1442, and a power amplifier supply voltage 1445 versus time. The graph 1449 corresponds to one example of waveforms for an implementation in which the power amplifier supply voltage 1445 is generated by average power tracking (APT).

APT is one technique for improving efficiency of a power amplifier, in which the voltage level of a power amplifier's supply voltage is controlled based on a power amplifier's average output power. When operating using APT, the voltage level of the power amplifier supply voltage can be substantially fixed for a particular time slot, but adjusted for a subsequent time slot based on average output power (for instance, transmission power control level). APT can achieve gain in efficiency relative to a fixed power amplifier supply voltage, but less efficiency gain compared to envelope tracking. However, envelope tracking can have a higher complexity, cost, and/or overhead relative to APT.

Applications

Some of the embodiments described above have provided examples in connection with mobile devices. However, the principles and advantages of the embodiments can be used for any other systems or apparatus that have needs for UHB architectures. Examples of such RF communication systems include, but are not limited to, mobile phones, tablets, base stations, network access points, customer-premises equipment (CPE), laptops, and wearable electronics.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A mobile device comprising:
   a transceiver configured to generate a low band radio frequency signal;
   a front-end system including a shared low band and second generation power amplifier module configured to amplify the low band radio frequency signal in a low band mode and a second generation radio frequency signal in a second generation mode; and
   a power management system including an envelope tracking power management unit configured to provide an envelope tracking supply voltage to the shared low band and second generation power amplifier module, and a first average power tracking power management unit configured to provide an average power tracking supply voltage to the shared low band and second generation power amplifier module, the shared low band and second generation power amplifier module including a supply voltage switch configured to select the envelope tracking supply voltage in the second generation mode and the average power tracking supply voltage in the low band mode.

2. The mobile phone of claim 1 wherein the front-end system further includes a first mid band and high band power amplifier module configured to receive power from the envelope tracking supply voltage and a second mid band and high band power amplifier module configured to receive power from the average power tracking supply voltage.

3. The mobile phone of claim 2 wherein the front-end system further includes an ultrahigh band power amplifier module configured to receive power from the average power tracking supply voltage.

4. The mobile phone of claim 2 wherein the power management system further includes an ultrahigh band power amplifier module and a second average power tracking power management unit configured to provide power to the ultrahigh band power amplifier module.

5. The mobile phone of claim 1 wherein the first average power tracking power management unit and the shared low band and second generation power amplifier module are on a first side of the mobile phone and the envelope tracking power management unit is on a second side of the mobile phone, the envelope tracking supply voltage crossing from the second side to the first side in the second generation mode.

6. The mobile phone of claim 1 wherein the low band radio frequency signal is a fourth generation signal or a fifth generation signal.

7. A phone board assembly for a mobile phone, the phone board assembly comprising:
   a shared low band and second generation power amplifier module configured to amplify a low band radio frequency signal in a low band mode and a second generation radio frequency signal in a second generation mode;
   an envelope tracking power management unit configured to provide an envelope tracking supply voltage to the shared low band and second generation power amplifier module; and
   a first average power tracking power management unit configured to provide an average power tracking supply voltage to the shared low band and second generation power amplifier module, the shared low band and second generation power amplifier module including a supply voltage switch configured to select the envelope tracking supply voltage in the second generation mode and the average power tracking supply voltage in the low band mode.

8. The phone board assembly of claim 7 further comprising a first mid band and high band power amplifier module configured to receive power from the envelope tracking supply voltage and a second mid band and high band power amplifier module configured to receive power from the average power tracking supply voltage.

9. The phone board assembly of claim 7 further comprising an ultrahigh band power amplifier module, the first average power tracking power management unit further configured to power the ultrahigh band power amplifier module.

10. The phone board assembly of claim 7 further comprising an ultrahigh band power amplifier module and a second average power tracking power management unit configured to power the ultrahigh band power amplifier module.

11. The phone board assembly of claim 7, wherein the first average power tracking power management unit and the shared low band and second generation power amplifier module are on a first side of the phone board assembly and the envelope tracking power management unit is on a second side of the phone board assembly, the envelope tracking supply voltage crossing from the second side to the first side in the second generation mode.

12. The phone board assembly of claim 7 wherein the low band radio frequency signal has a frequency content of 1 gigahertz or less.

13. The phone board assembly of claim 7 wherein the low band radio frequency signal is a fourth generation signal or a fifth generation signal.

14. A method of power management in a mobile device, the method comprising:
    amplifying a low band radio frequency signal using a shared low band and second generation power amplifier module in a low band mode;
    amplifying a second generation radio frequency signal using the shared low band and second generation power amplifier module in a second generation mode;
    providing an envelope tracking supply voltage to the shared low band and second generation power amplifier module using an envelope tracking power management unit;
    providing an average power tracking supply voltage to the shared low band and second generation power amplifier module using a first average power tracking power management unit;
    selecting the envelope tracking supply voltage using a supply voltage switch of the shared low band and second generation power amplifier module in the second generation mode; and
    selecting the average power tracking supply voltage using the supply voltage switch of the shared low band and second generation power amplifier module in the low band mode.

15. The method of claim 14 further comprising powering a first mid band and high band power amplifier module using the envelope tracking supply voltage and powering a second mid band and high band power amplifier module using the average power tracking supply voltage.

16. The method of claim 14 further comprising powering an ultrahigh band power amplifier module using the first average power tracking power management unit.

17. The method of claim 14 further comprising powering an ultrahigh band power amplifier module using a second average power tracking power management unit.

18. The method of claim 14 wherein the first average power tracking power management unit and the shared low band and second generation power amplifier module are on a first side of a mobile phone and the envelope tracking power management unit is on a second side of the mobile phone, the method further comprising providing the envelope tracking supply voltage from the second side to the first side in the second generation mode.

19. The method of claim 14 wherein the low band radio frequency signal has a frequency content of 1 gigahertz or less.

20. The method of claim 14 wherein the low band radio frequency signal is a fourth generation signal or a fifth generation signal.

* * * * *